(12) United States Patent
Umatate et al.

(10) Patent No.: US 8,795,953 B2
(45) Date of Patent: Aug. 5, 2014

(54) PATTERN FORMING METHOD AND METHOD FOR PRODUCING DEVICE

(75) Inventors: Toshikazu Umatate, Hino (JP); Soichi Owa, Kumagaya (JP); Tomoharu Fujiwara, Gyoda (JP)

(73) Assignee: Nikon Corporation, Tokyo (JP)

( * ) Notice: Subject to any disclaimer, the term of this patent is extended or adjusted under 35 U.S.C. 154(b) by 170 days.

(21) Appl. No.: 13/227,178

(22) Filed: Sep. 7, 2011

(65) Prior Publication Data

US 2012/0225388 A1    Sep. 6, 2012

Related U.S. Application Data

(60) Provisional application No. 61/382,630, filed on Sep. 14, 2010.

(51) Int. Cl.
   *G03F 7/26*    (2006.01)
(52) U.S. Cl.
   USPC ............................... 430/314; 430/311
(58) Field of Classification Search
   USPC .................................. 430/311, 314
   See application file for complete search history.

(56) References Cited

U.S. PATENT DOCUMENTS

| | | | |
|---|---|---|---|
| 5,448,332 | A | 9/1995 | Sakakibara et al. |
| 2003/0025890 | A1 | 2/2003 | Nishinaga |
| 2007/0242247 | A1 | 10/2007 | Shiraishi |
| 2011/0104901 | A1 | 5/2011 | Yatsuda et al. |

FOREIGN PATENT DOCUMENTS

| | | |
|---|---|---|
| JP | A-2008-235462 | 10/2008 |
| JP | A-2009-194248 | 8/2009 |
| WO | WO 2009/101878 A1 | 8/2009 |
| WO | WO 2009/150870 A1 | 12/2009 |

OTHER PUBLICATIONS

Dec. 20, 2011 International Search Report issued in PCT/JP2011/070986 (with translation).
Hazelton et al.; "Double-patterning requirements for optical lithography and prospects for optical extension without double patterning;" *J. Micro/Nanolith. MEMS MOEMS*; Jan.-Mar. 2009; pp. 011003-1-011003-11; vol. 8, No. 1.
Ooki et al.; "Experimental study on non-linear multiple exposure method;" *Proc. SPIE*; 1997; pp. 85-93; vol. 3051.
Jung et al.; "Patterning with amorphous carbon spacer for expanding the resolution limit of current lithography tool;" *Proc. of SPIE*; 2007; pp. 65201C-1-65201C-9; vol. 6520.
Dec. 20, 2011 Written Opinion issued in International Patent Application No. PCT/JP2011/070986 (with translation).

*Primary Examiner* — Kathleen Duda
(74) *Attorney, Agent, or Firm* — Oliff PLC

(57) ABSTRACT

In a pattern forming method, a first L & S pattern is formed on a wafer; a first protective layer, a second L & S pattern having a perpendicular periodic direction to that of the first L & S pattern, and a photoresist layer are formed to cover the first L & S pattern; a third pattern having first apertures is formed in the photoresist layer to be overlapped with a part of the second L & S pattern; second apertures are formed in the first protective layer via the first apertures; and a part of the first L & S pattern is removed via the second apertures. Accordingly, a pattern including a non-periodic portion finer than a resolution limit of an exposure apparatus is formed.

26 Claims, 31 Drawing Sheets

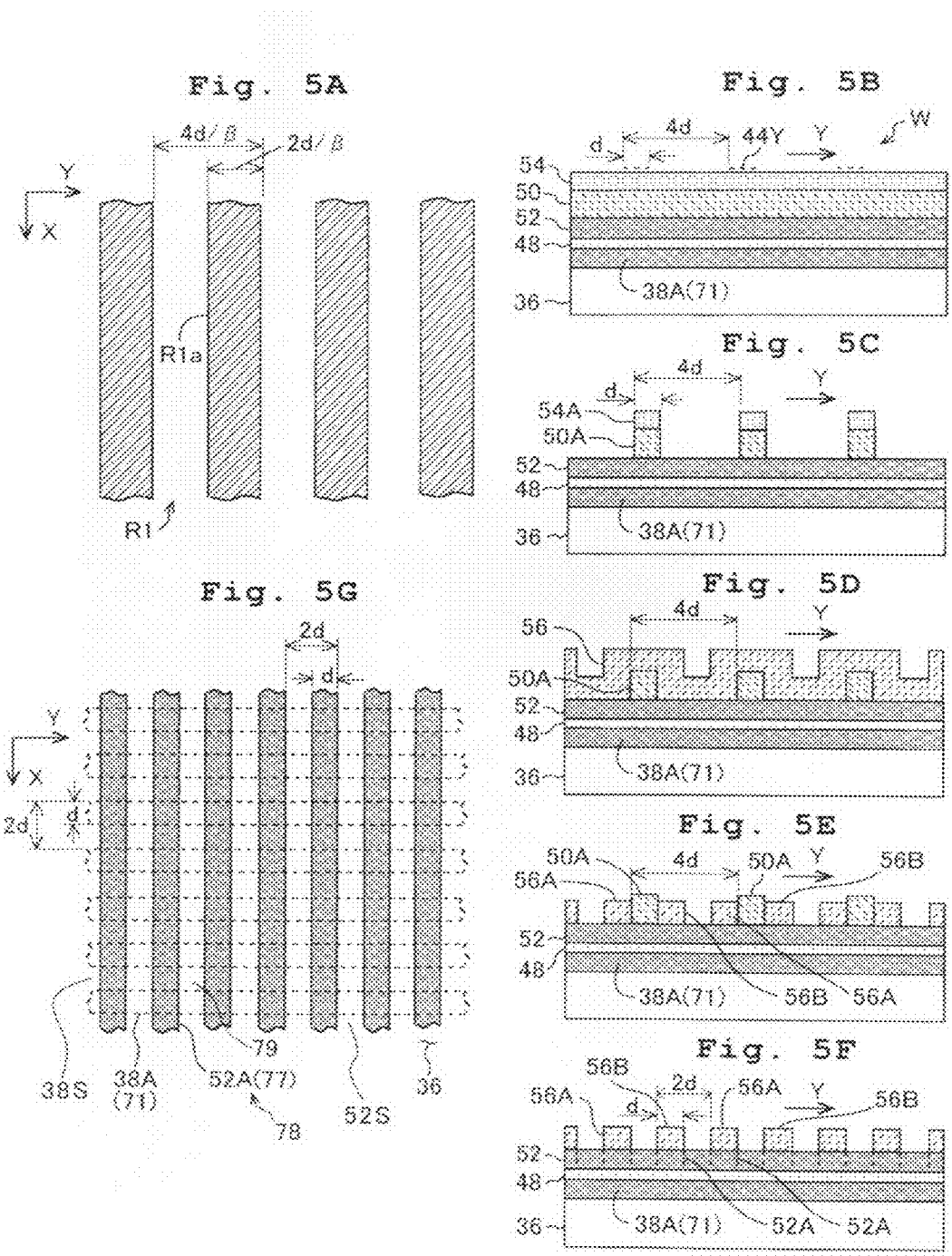

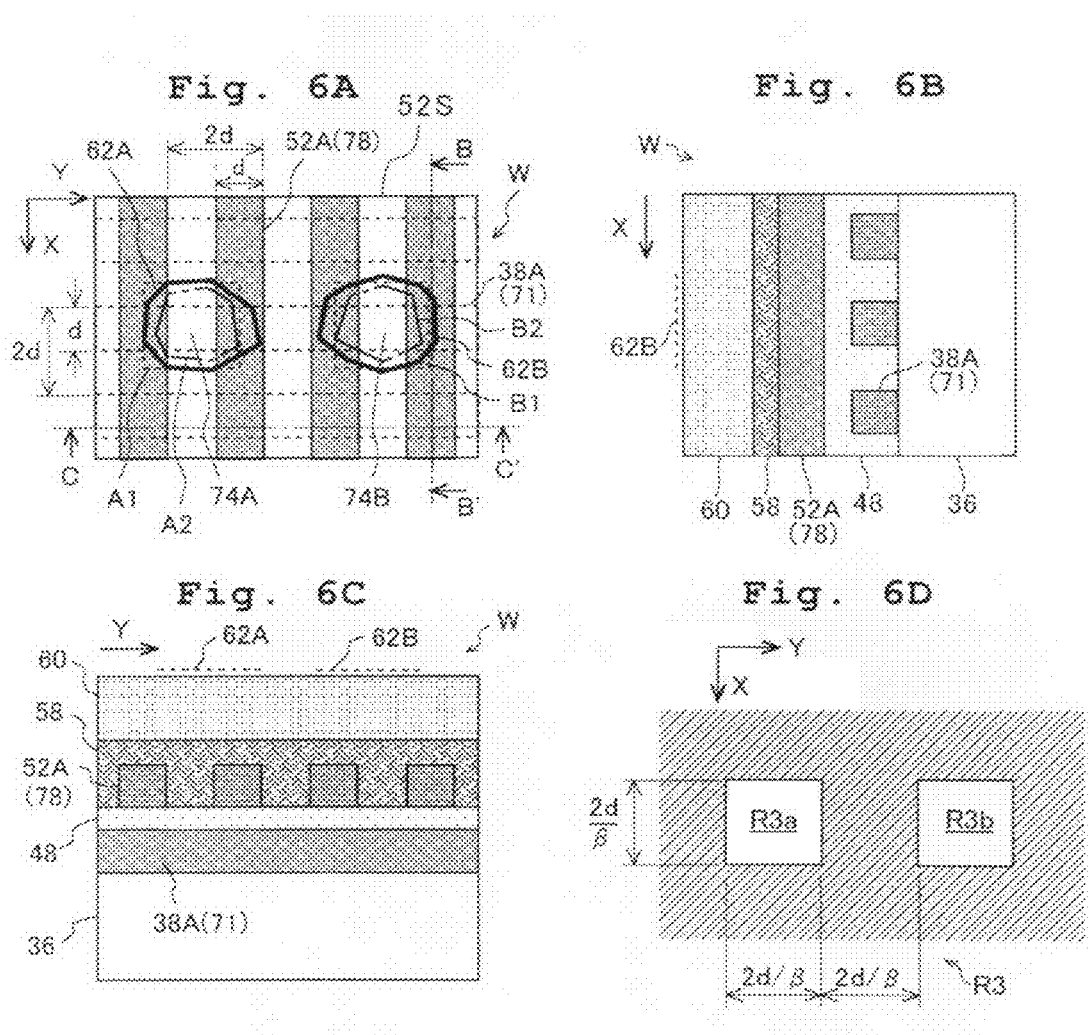

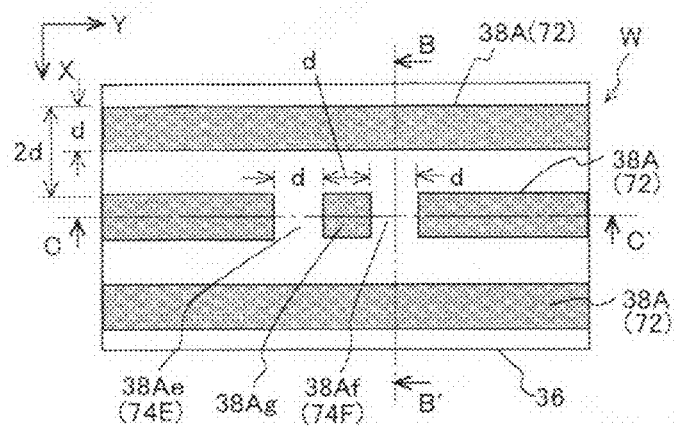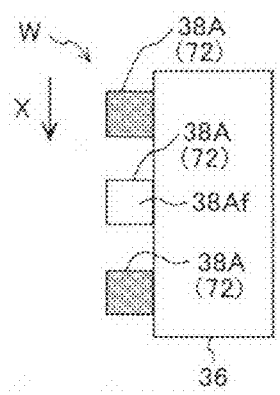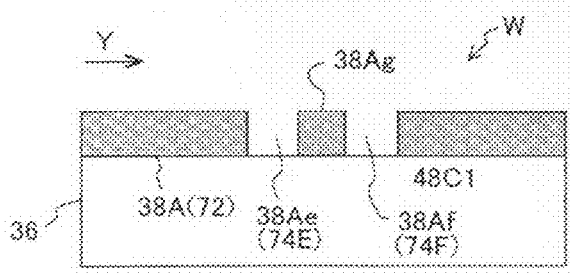

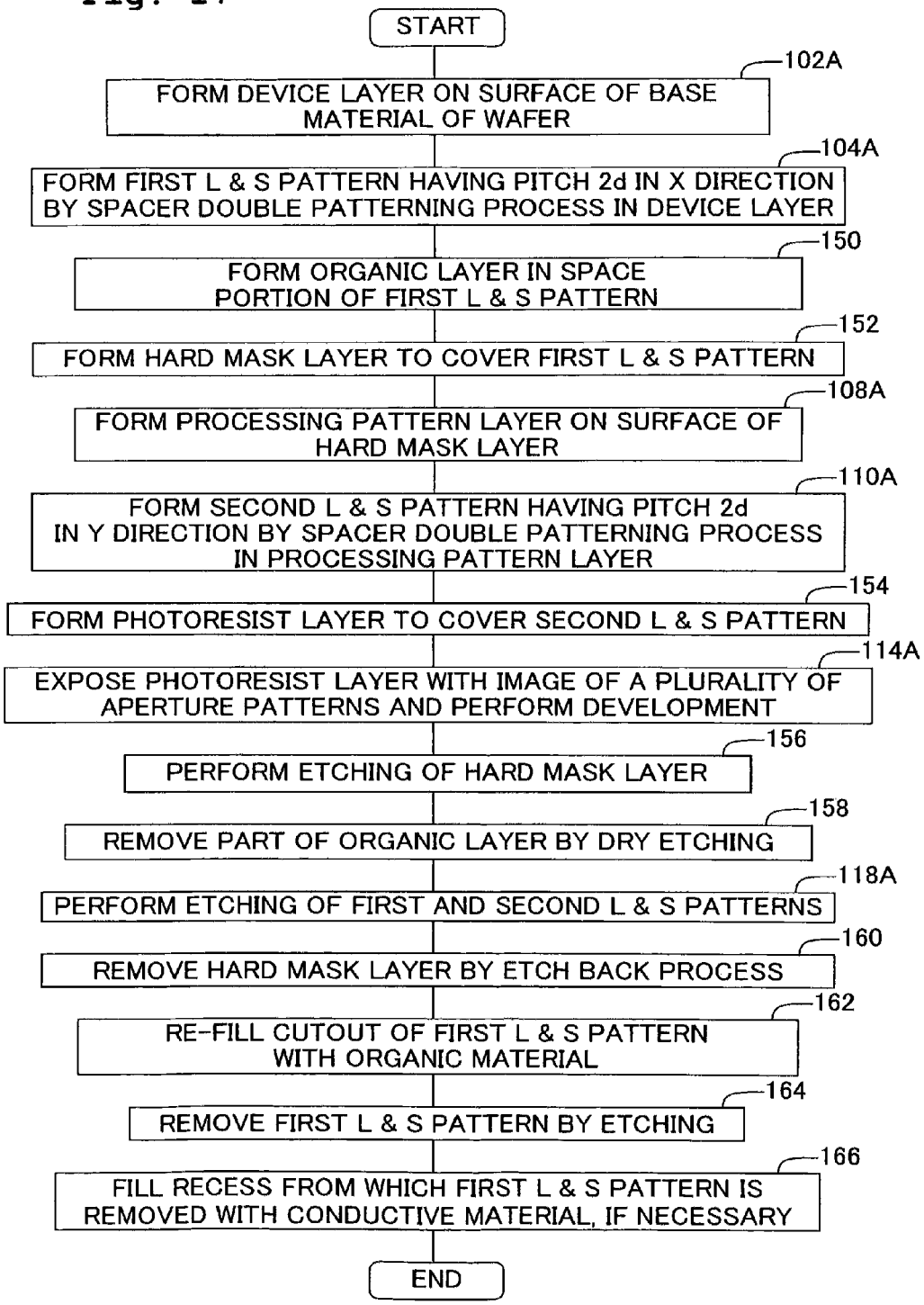

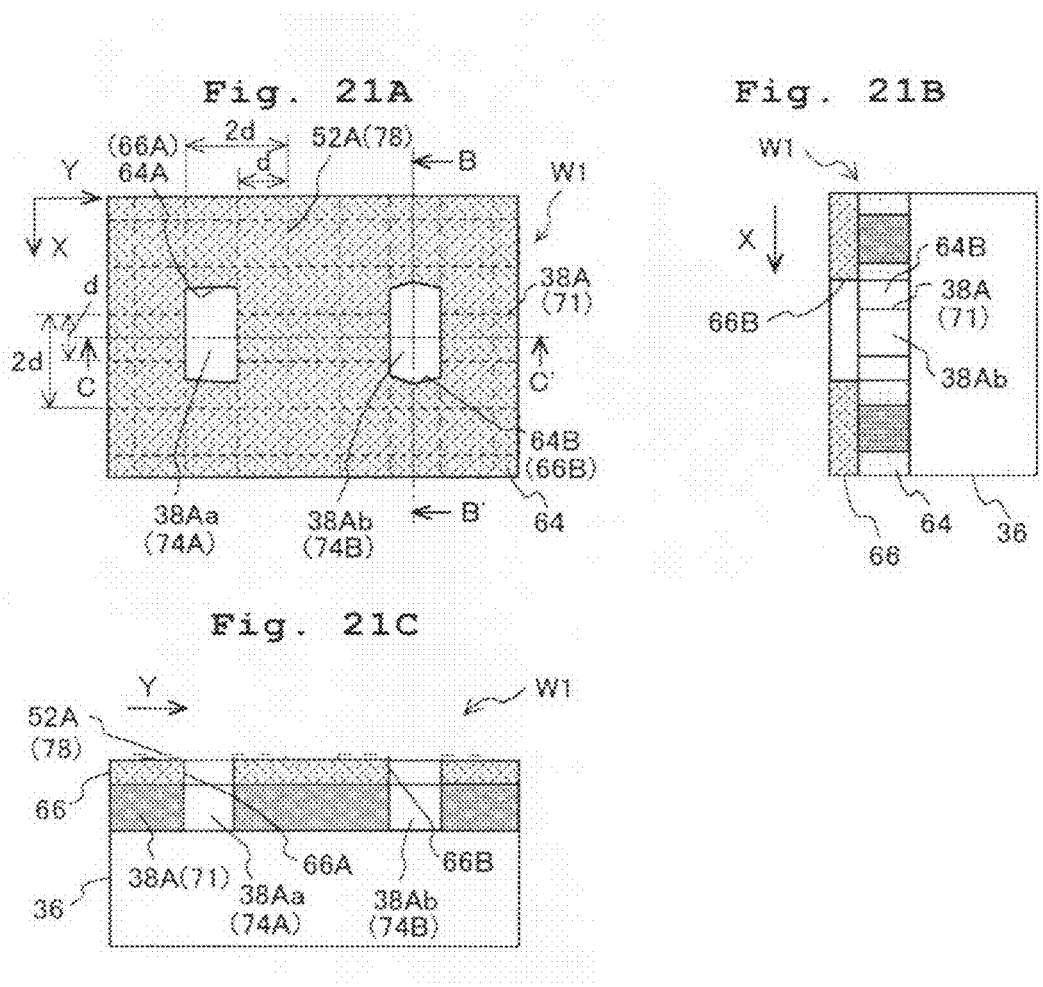

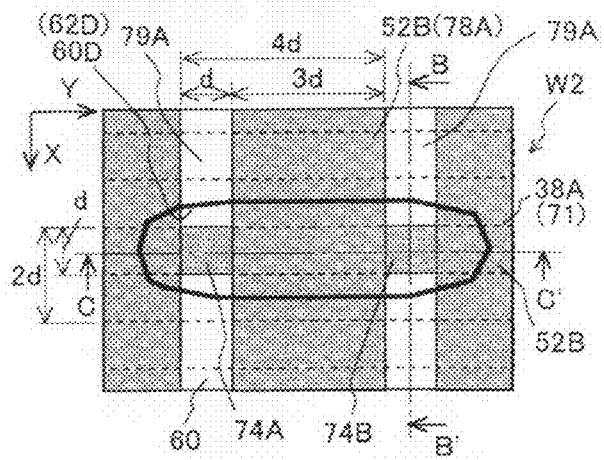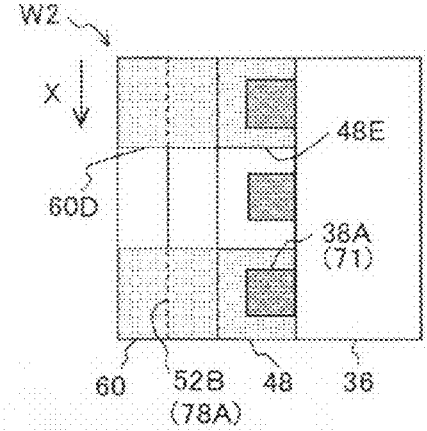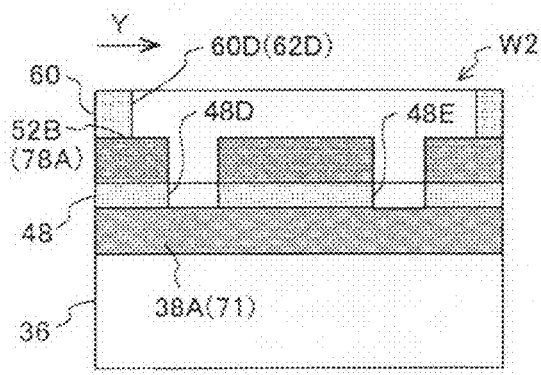

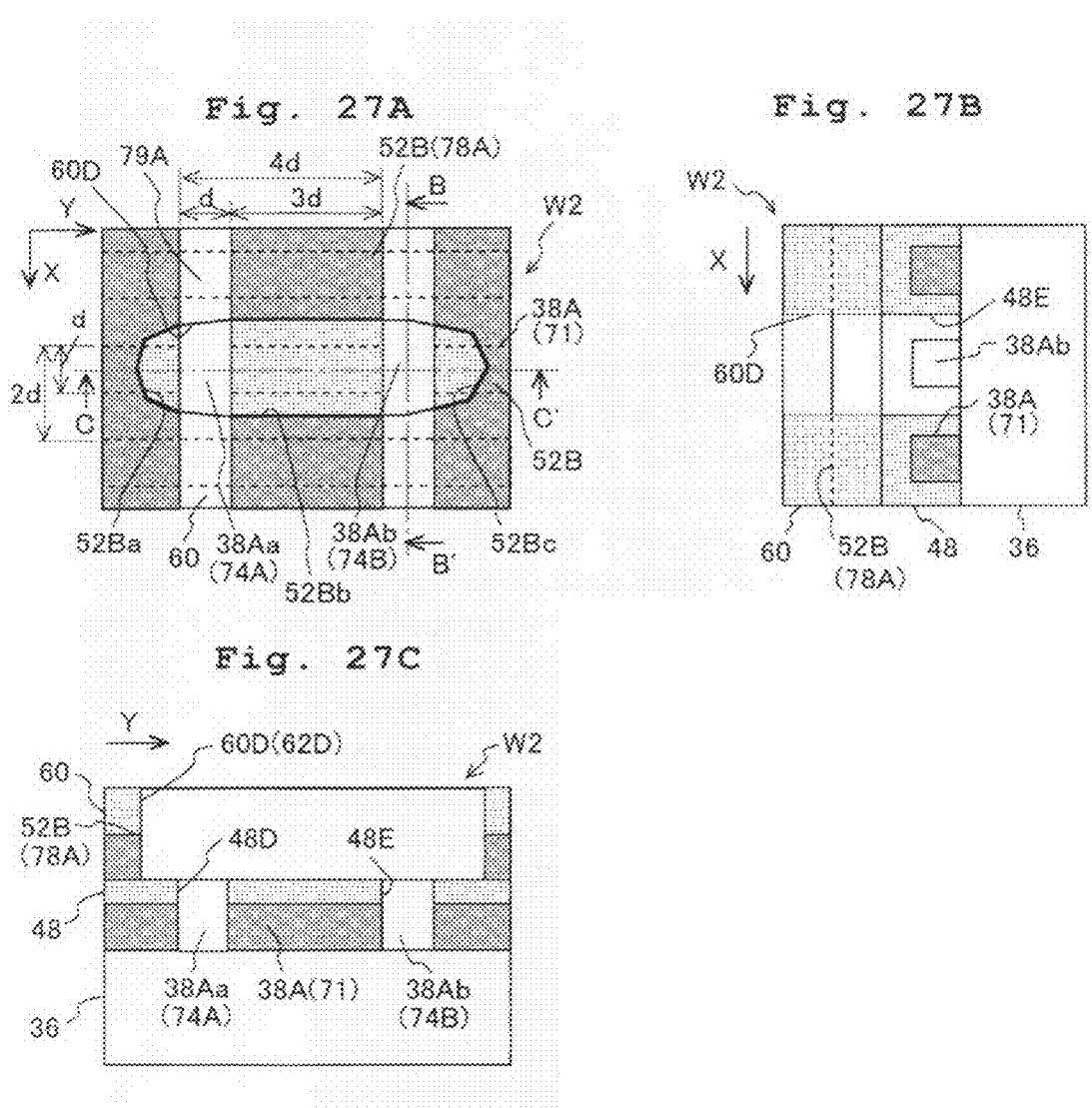

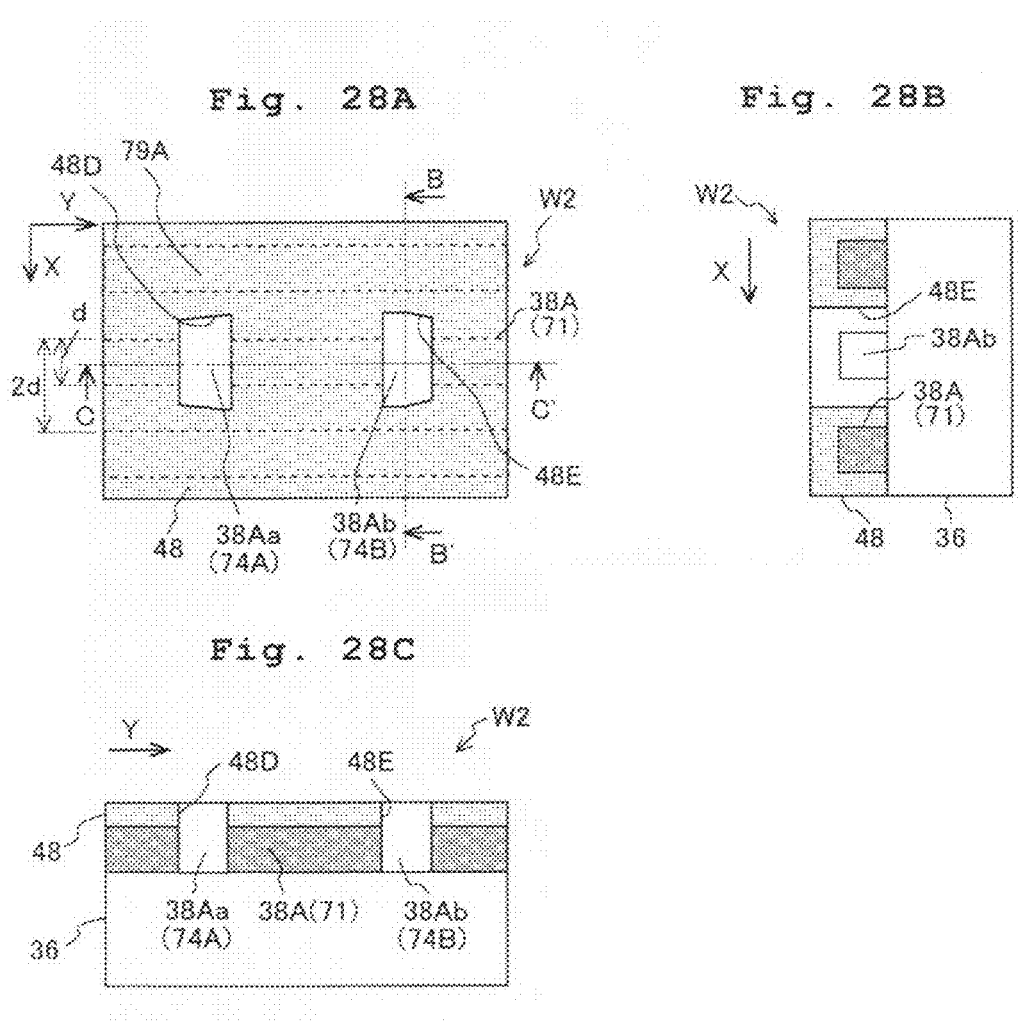

US 8,795,953 B2

PATTERN FORMING METHOD AND METHOD FOR PRODUCING DEVICE

CROSS-REFERENCE TO RELATED APPLICATION

This application claims the benefit of priority of U.S. Provisional Application Ser. No. 61/382,630 filed on Sep. 14, 2010, and the disclosure of U.S. Provisional Application Ser. No. 61/382,630 is incorporated herein by reference in its entirety.

BACKGROUND

1. Field

The present teaching relates to a pattern forming method for forming a pattern on a substrate, and a method for producing a device using the pattern forming method.

2. Description of the Related Art

In order to enhance the resolution in an exposure apparatus which is used in the lithography step of producing a microdevice, an electronic device, etc. such as a semiconductor device or the like and which uses, for example, the ultraviolet light ranging from the far ultraviolet region to the vacuum ultraviolet region as the exposure light (exposure light beam), for example, the exposure wavelength has been shortened, the illumination condition has been optimized, and the liquid immersion method has been applied. Recently, in order to form a periodic circuit pattern having a pitch finer than the resolution limit of the exposure apparatus, the pitch-splitting process and the spacer double patterning process (Spacer transfer Process or Sidewall transfer Process) have been suggested. See, for example, Andrew J., Hazelton et al., "Double-patterning requirements for optical lithography and prospects for optical extension without double patterning", J. Micro/Nanolith. MEMS MOEMS, (United States) Vol. 8 (1), 011003, January-March (2009).

The former pitch-splitting process is roughly classified into the double exposure process and the double patterning process. In the double exposure process, images of patterns of first and second masks having a pitch twice the device pattern to be finally formed are transferred to a nonlinear resist in such a state that the phases are deviated (shifted) from each other, and then the etching is performed. See, for example, H. Ohki et al., "Experimental study on non-linear multiple exposure method", Proc. SPIE (United States) 3051, p. 85-93 (1997). In the double patterning process, a process such as the etching or the like is executed between the exposure with an image of a first mask pattern and the exposure with an image of a second mask pattern.

In the latter spacer double patterning process (spacer process method), for example, a plurality of line patterns having ¼ pitch are formed by performing the exposure and the development with an image of a mask pattern having a pitch which is twice the device pattern. A spacer is deposited on space portions (side wall portions) located on the both sides of the respective line patterns, for example, and then the respective line patterns are removed. Thus, the pattern having ½ pitch is obtained. See, for example, W. Jung et al., "Patterning with amorphous carbon spacer for expanding the resolution limit of current lithography tool", Proc. SPIE (United States) 6520, 65201C (2007).

SUMMARY

According to a first aspect of the present teaching, there is provided a pattern forming method for forming a pattern, the method comprising: forming a first pattern having a first line pattern on a substrate; forming a first thin film to cover the first pattern; forming a second pattern, having a second line pattern extending in a direction intersecting the first line pattern, on the first thin film; forming a photosensitive layer to cover the second pattern; forming a third pattern having a first aperture in the photosensitive layer so that the third pattern is overlapped with at least a part of the second pattern; forming a second aperture in the first thin film by removing a part of the first thin film via the first aperture of the third pattern formed in the photosensitive layer; removing a part of the first pattern via the second aperture of the first thin film; and removing the first thin film and the second pattern.

According to a second aspect of the present teaching, there is provided a pattern forming method for forming a pattern, the method comprising: forming a first line and space pattern having a plurality of first lines and a plurality of first spaces arranged alternately in a predetermined direction on a substrate; forming a second line and space pattern, having a plurality of second lines and a plurality of second spaces arranged alternately in a direction intersecting the predetermined direction, on the first line and space pattern; removing a partial area of a first line, included in the plurality of first lines and existing in a plurality of overlap areas in which the plurality of first lines of the first line and space pattern and the plurality of second spaces of the second line and space pattern are overlapped with one another, by performing etching using a pair of second lines, included in the plurality of second lines and defining the partial area of the first line, as a mask; and removing the second line and space pattern to form a non-periodic line and space pattern in which a part of the first line of the first line and space pattern is removed.

According to a third aspect of the present teaching, there is provided a method for producing a device, the method comprising a step of forming a pattern from which a part of a predetermined pattern is removed on a substrate by using the pattern forming method as defined in the first or second aspect of the present teaching. According to a fourth aspect of the present teaching, there is provided a method for producing a device, the method comprising using the pattern forming method as defined in the first or second aspect of the present teaching.

BRIEF DESCRIPTION OF THE DRAWINGS

FIG. 5A shows an enlarged plan view of a part of a pattern of a second reticle; FIG. 5B shows an enlarged sectional view of the wafer W formed with a processing pattern layer, etc.; FIG. 5C shows an enlarged sectional view of the wafer W after etching a second intermediate layer on the processing pattern layer; FIG. 5D shows an enlarged sectional view of the wafer W on which a second spacer layer is deposited; FIG. 5E shows an enlarged sectional view of the wafer W after etching the second spacer layer; FIG. 5F shows an enlarged sectional view of the wafer W after removing the pattern of the second intermediate layer; and FIG. 5G shows an enlarged plan view of a second L & S pattern 78 formed in the processing pattern layer.

FIG. 6A shows an enlarged plan view of a part of the wafer W exposed with an image of a pattern of a third reticle, FIG. 6B shows a sectional view taken along a line BB' shown in FIG. 6A, FIG. 6C shows a sectional view taken along a line CC' shown in FIG. 6A, and FIG. 6D shows an enlarged plan view of a part of the pattern of the third reticle.

FIG. 16A shows an enlarged plan view of a part of the wafer W in which the second L & S pattern 78 and the protective layer are removed, continuously to the state shown in FIG. 15A, FIG. 16B shows a sectional view taken along a line BB' shown in FIG. 16A, and FIG. 16C shows a sectional view taken along a line CC' shown in FIG. 16A.

FIG. 17 shows a flow chart illustrating a pattern forming method according to a second embodiment.

FIG. 21A shows an enlarged plan view of a part of the wafer W1 in which the second L & S pattern 78 is removed and a part of the first L & S pattern 71 is removed, FIG. 21B shows a sectional view taken along a line BB' shown in FIG. 21A, and FIG. 21C shows a sectional view taken along a line CC' shown in FIG. 21A.

FIG. 26A shows an enlarged plan view of a part of the wafer W2 in which a part of a photoresist layer and a part of a first protective layer are removed, FIG. 26B shows a sectional view taken along a line BB' shown in FIG. 26A, and FIG. 26C shows a sectional view taken along a line CC' shown in FIG. 26A.

FIG. 27A shows an enlarged plan view of a part of the wafer W2 in which a part of a L & S pattern 71 and a part of a L & S pattern 78A are removed, FIG. 27B shows a sectional view taken along a line BB' shown in FIG. 27A, and FIG. 27C shows a sectional view taken along a line CC' shown in FIG. 27A.

FIG. 28A shows an enlarged plan view of a part of the wafer W2 in which the photoresist layer and the second L & S pattern 78A are removed, FIG. 28B shows a sectional view taken along a line BB' shown in FIG. 28A, and FIG. 28C shows a sectional view taken along a line CC' shown in FIG. 28A.

DESCRIPTION OF THE EMBODIMENTS

First Embodiment

A first embodiment of the present teaching will be explained with reference to FIGS. 1 to 16. At first, an explanation will be made about an example of the pattern forming system used to form a circuit pattern of, for example, a microdevice or an electronic device such as a semiconductor element or the like in this embodiment.

Figure 1A:
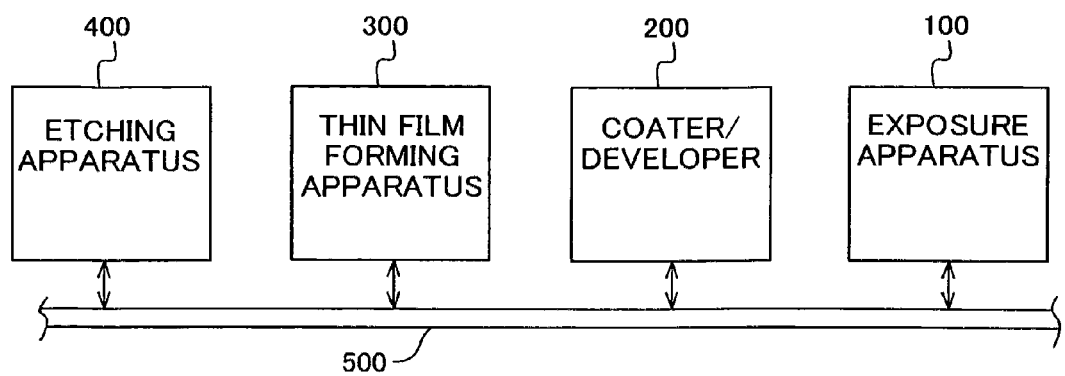
FIG. 1A shows a block diagram illustrating main components of a pattern forming system used in an embodiment.
Figure 1B:
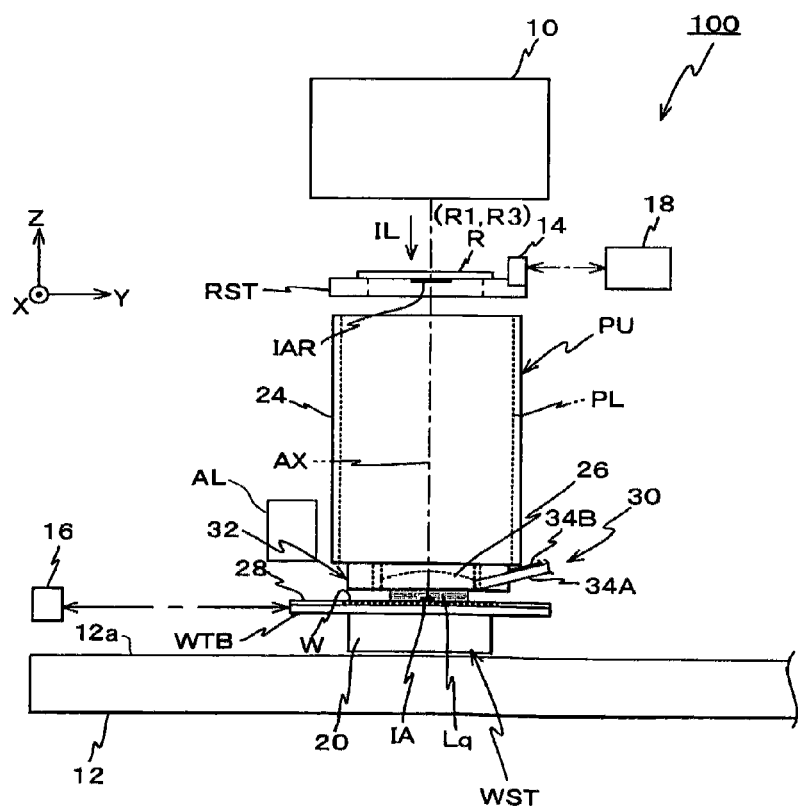
FIG. 1B shows a schematic construction of an exposure apparatus 100 shown in FIG. 1A.

FIG. 1A shows main components of a pattern forming system of this embodiment, and FIG. 1B shows a schematic construction of an exposure apparatus 100 (illustrating a scanning stepper as an example of the exposure apparatus in this embodiment) shown in FIG. 1A. With reference to FIG. 1A, the pattern forming system includes the exposure apparatus 100, a coater/developer 200 which coats or applies a substrate such as a wafer or the like with a photoresist (photosensitive material) and which performs the development, a thin film forming apparatus 300, an etching apparatus 400 which performs the dry etching and the wet etching with respect to the wafer, a transport system 500 which performs the transport among the apparatuses, a host computer (not shown), and the like.

With reference to FIG. 1B, the exposure apparatus 100 is provided with an illumination system 10, a reticle stage RST which holds a reticle R (mask) illuminated with an illumination light (illumination light beam; exposure light) IL for the exposure via the illumination system 10, a projection unit PU including a projection optical system PL which projects the illumination light IL emitted from the reticle R onto a surface of a wafer W (substrate), and a wafer stage WST which holds the wafer W. The exposure apparatus 100 also includes, for example, a main controller (not shown) which is constructed of a computer for integrally controlling the operation of the entire apparatus. In the following description, as shown in FIG. 1B, it is assumed that the Z axis is the axis extending in the direction parallel to the optical axis AX of the projection optical system PL, the Y axis is the axis extending in the direction in which the reticle R and the wafer W are subjected to the relative scanning in a plane (substantially a horizontal plane) perpendicular thereto, and the X axis is the axis extending in a direction perpendicular to the Z axis and the Y axis. It is assumed that the directions of rotation (inclination) about the X axis, the Y axis, and the Z axis are θx, θy, and θz directions respectively.

The illumination system 10 includes a light source which generates the illumination light IL, and an illumination optical system which illuminates the reticle R with the illumination light IL, as disclosed, for example, in United States Patent Application Publication No. 2003/025890. As an example of the illumination light, the ArF excimer laser beam (wavelength: 193 nm) is used as the illumination light IL. It is also possible to use, as the illumination light IL, the KrF excimer laser beam (wavelength: 248 nm), the high harmonic wave such as the YAG laser or the solid laser (for example, the semiconductor laser), or the emission line (for example, i-ray) of the mercury lamp.

The illumination optical system has, for example, an illuminance uniformalizing optical system including, for example, a polarization control optical system, a light amount distribution forming optical system (for example, a diffraction optical element or a spatial light modulator), and an optical integrator (for example, a fly's eye lens or a rod integrator (internal surface reflection type integrator)), and a reticle blind (variable field stop) (any one of them is not shown). A slit-shaped illumination area IAR which is long in the X direction of a pattern surface (lower surface) of the reticle R defined by the reticle blind is illuminated by the illumination system 10 under an illumination condition including, for example, the dipole illumination, the quadruple illumination, the annular (zonal) illumination, the illumination having a small coherence factor (σ value), or the ordinary illumination, with the illumination light IL in a predetermined polarization state at an approximately uniform illuminance distribution.

The reticle stage RST, which holds the reticle R by the vacuum attraction, etc. is placed on the upper surface of a reticle base (not shown) parallel to the XY plane so that the reticle stage RST is movable at a constant velocity in the Y direction and that the positions in the X direction and the Y direction and the angle of rotation in the θZ direction are adjustable. The position information of the reticle stage RST is always detected at a resolution of, for example, about 0.5 to 0.1 nm via a movement mirror 14 (or a mirror-finished side surface of the stage) by a reticle interferometer 18 including a laser interferometer of a plurality of axes. A reticle stage driving system (not shown) including a linear motor, etc. is controlled based on the measured value obtained by the reticle interferometer 18, and thus the position and the velocity of the reticle stage RST are controlled.

The projection unit PU, which is arranged under or below the reticle stage RST, includes a barrel 24, and the projection optical system PL which has a plurality of optical elements held in a predetermined positional relationship in the barrel 24. The projection optical system PL is, for example, telecentric on the both sides, and has a predetermined projection magnification b (reduction magnification of, for example, ¼-fold or ⅕-fold). An image of a circuit pattern in the illumination area IAR of the reticle R is formed via the projection optical system PL in an exposure area IA (area conjugated with the illumination area IAR) in one shot area of the wafer W by the illumination light IL allowed to pass through the reticle R. The wafer W as the substrate of this embodiment includes, for example, a material in which a thin film (for example, an oxide film, a metal film, or a polysilicon film) for the pattern formation is formed on a surface of a disk-shaped base material having a diameter of about 200 mm or 300 mm composed of, for example, silicon (or may be composed of SOI (silicon on insulator) as well). Further, the surface of the wafer W as the exposure objective is coated with a photoresist (photosensitive material) to provide a predetermined thickness (for example, about several 10 nm to 200 nm).

The exposure apparatus 100 includes a local liquid immersion apparatus 30 which supplies a liquid Lq to a space between the wafer and an end-portion lens 26 disposed at the end portion as an optical element which is disposed on the side nearest to the image plane (side of the wafer W) and which is included in a plurality of optical elements possessed by the projection optical system PL, in order to perform the exposure (exposure method) to which the liquid immersion method is applied. A liquid immersion area is formed by the liquid immersion apparatus 30 only in a partial area on the upper surface of the wafer W. The local liquid immersion apparatus 30 is provided with a nozzle unit 32 which is arranged around the lower end portion of the barrel 24, i.e., to surround the surroundings of the end-portion lens 26. A supply port of the nozzle unit 32 for supplying the liquid Lq is connected to a liquid supply device (not shown) via a supply flow passage and a supply tube 34A. A recovery port of the nozzle unit 32 for recovering the liquid Lq is connected to a liquid recovery device (not shown) via a recovery flow passage and a recovery tube 34B. The detailed construction of the local liquid immersion apparatus 30 is disclosed, for example, in United States Patent Application Publication No. 2007/242247 of which contents are incorporated herein by reference in their entirety.

The wafer stage WST is placed movably in the X direction and the Y direction on an upper surface 12a, of a base board (base plate) 12, parallel to the XY plane. The wafer stage WST is provided with a stage body 20, a wafer table WTB which is provided on the upper surface of the stage body 20, and a Z leveling mechanism which is provided in the stage body 20 and which relatively drives the tilt angles in the θx direction and the θy direction and the position (Z position) in the Z direction of the wafer table WTB (wafer W) with respect to the stage body 20. A wafer holder (not shown), which holds the wafer W on an attraction surface (suction surface) approximately parallel to the XY plane by, for example, the vacuum attraction, is provided on the wafer table WTB. A flat plate-shaped plate (liquid-repellent plate) 28, which forms substantially the same plane as the surface of the wafer W (wafer surface) and which has the surface subjected to the liquid-repelling treatment with respect to the liquid Lq, is provided around the wafer holder (wafer W) disposed on the upper surface of the wafer table WTB.

An autofocus sensor (not shown) based on the oblique incidence system, which measures the Z positions of a plurality of measuring points of the wafer surface, is provided. The autofocus sensor is constructed in the same manner as in the disclosure disclosed, for example, in U.S. Pat. No. 5,448,332. The Z leveling mechanism of the wafer stage WST is driven so that the wafer surface is focused with respect to the image plane of the projection optical system PL based on the measured value obtained by the autofocus sensor during the exposure.

Reflecting surfaces are formed on the end surfaces in the Y direction and the X direction of the wafer table WTB by the mirror-finishing processing respectively. Interferometer beams are projected onto the reflecting surfaces (or it is allowable that the interferometer beams are projected onto the movement mirrors) from the laser interferometer having the plurality of axes and constructing the wafer interferometer 16 respectively. By doing so, the position information of the wafer stage WST (including at least the positions in the X direction and the Y direction and the angle of rotation in the θz direction) is measured, for example, at a resolution of about 0.5 to 0.1 nm. A wafer stage driving system (not shown), which includes a linear motor, etc. is controlled based on the measured value, and thus the position and the velocity of the wafer stage WST are controlled. The position information of the wafer stage WST may be measured by using a detecting apparatus based on the encoder system and having a diffraction grating-shaped scale and a detection head.

The exposure apparatus 100 is provided with a wafer alignment system AL which measures the position of a predetermined alignment mark of the wafer W, and a spatial image measuring system (not shown) which is contained in the wafer stage WST in order to measure the position of an image of an alignment mark of the reticle R formed by the projection optical system PL. The alignment is performed for the reticle R and the respective shot areas of the wafer W by using the spatial image measuring system (reticle alignment system) and the wafer alignment system AL.

When exposing the wafer W, the wafer stage WST is step-moved in the X direction and the Y direction, and thus the shot area of the wafer W as the exposure objective is moved to the position in front of the exposure area IA. Further, the liquid Lq is supplied from the local liquid immersion apparatus 30 to the space between the projection optical system PL and the wafer W. The image of a part of the pattern of the reticle R, which is formed by the projection optical system PL, is projected onto one shot area of the wafer W, while the reticle R and the wafer W are moved synchronously in the Y direction via the reticle stage RST and the wafer stage WST. By doing so, the concerning shot area is subjected to the scanning exposure with the image of the pattern of the reticle R. The step movement and the scanning exposure are repeated, and thus the respective shot areas of the wafer W are exposed with the image of the pattern of the reticle R respectively in the step-and-scan manner and the liquid immersion manner.

Figure 2:
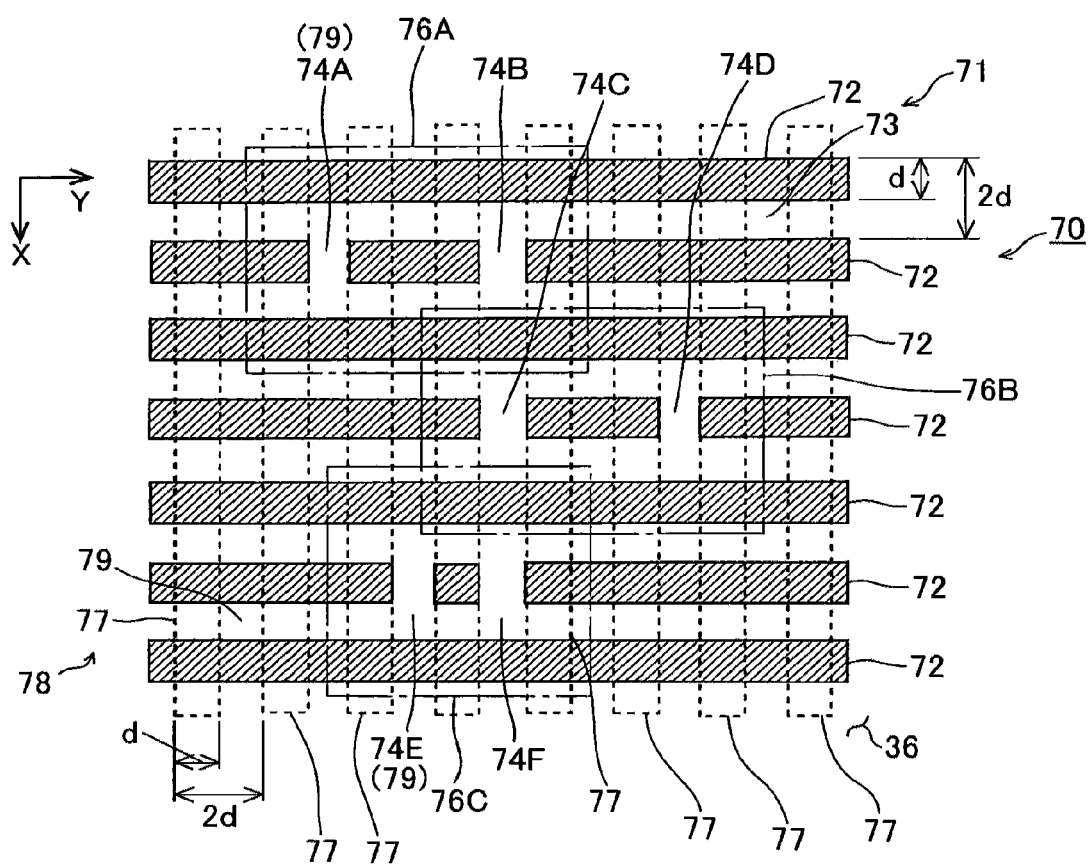
FIG. 2 shows an enlarged view of a part of a circuit pattern of a certain layer of an electronic device produced in the embodiment.

Next, as shown in a partial enlarged view in FIG. 2, the circuit pattern, which is the objective of the production in this embodiment, is a circuit pattern 70 for a gate cell of SRAM (Static RAM) as a semiconductor element. In the following description, a line-and-space pattern is referred to as "L & S pattern". The circuit pattern 70 is formed by removing parts of a plurality of line patterns 72 of a first L & S pattern 71 in which line patterns 72 each having a line width d and space portions 73 each having a width d are arranged at a pitch (period) 2d in the periodic direction (hereinafter designated as "X direction") on a surface of a base material 36 of the wafer. For example, with reference to FIG. 2, the circuit pattern 70 has a plurality of separation portions 74A to 74F (non-periodic portions) which are formed by removing portions of the first L & S pattern 71, which have widths d in (in relation to) the Y direction perpendicular to the X direction, from the alternate line patterns. In this embodiment, an explanation will be made assuming that the directions of the X axis and the Y axis shown in FIG. 2 are parallel to the directions of the X axis and the Y axis in the exposure apparatus 100, in a case that the wafer W, on which the circuit pattern 70 shown in FIG. 2 is to be formed, is placed on the wafer stage WST of the exposure apparatus 100 shown in FIG. 1B.

In this embodiment, it is assumed that the line width d is finer or more minute than the resolution limit of the exposure apparatus 100 of the liquid immersion type (half pitch, in the case of the periodic pattern). Therefore, the line width d of the first L & S pattern 71 is finer than the resolution limit of the exposure apparatus 100. Further, the circuit pattern 70 is also a pattern which includes non-periodic portions each having the width d finer than the resolution limit of the exposure apparatus 100. As an example, the line width d is approximately ½ of the resolution limit of the exposure apparatus 100. In other words, the resolution limit of the exposure apparatus 100 is approximately 2d. The resolution limit of the exposure apparatus 100 is, for example, about 40 to 50 nm, and the line width d is about 20 to 25 nm corresponding thereto. In the following description, it is assumed that the resolution limit of the exposure apparatus 100 is about 40 nm (half pitch), and the line width d is about 20 nm.

With reference to FIG. 2, as depicted by dotted lines, a second L & S pattern 78 is assumed, in which line patterns 77 each having a line width d and space portions 79 each having a width d are arranged at a pitch 2d in the Y direction so that the second L & S pattern 78 is perpendicular to the first L &

S pattern 71. In this case, the separation portions 74A to 74F, which are included in the first L & S pattern 71, are the portions each of which intersects any one of the space portions 79 of the second L & S pattern 78. For example, each of the spacing distance between the separation portions 74A, 74B of the line pattern 72 in a first area 76A and the spacing distance between the separation portions 74C, 74D of the line pattern 72 in a second area 76B corresponds to the width (=3d) of one space portion 79 and two line patterns 77 of the second L & S pattern 78. The spacing distance between the separation portions 74E, 74F of the line pattern 72 in a third area 76C corresponds to the width (=d) of one space portion 79 of the second L & S pattern 78. In this case, the position in the Y direction of the second L & S pattern 78 is set, for example, based on an alignment mark (not shown) used when the first L & S pattern 71 is formed. The positions and the numbers of the separation portions 74A to 74F are arbitrary on condition that each of the separation portions 74A to 74F intersects any one of the space portions 79.

Figure 3A:
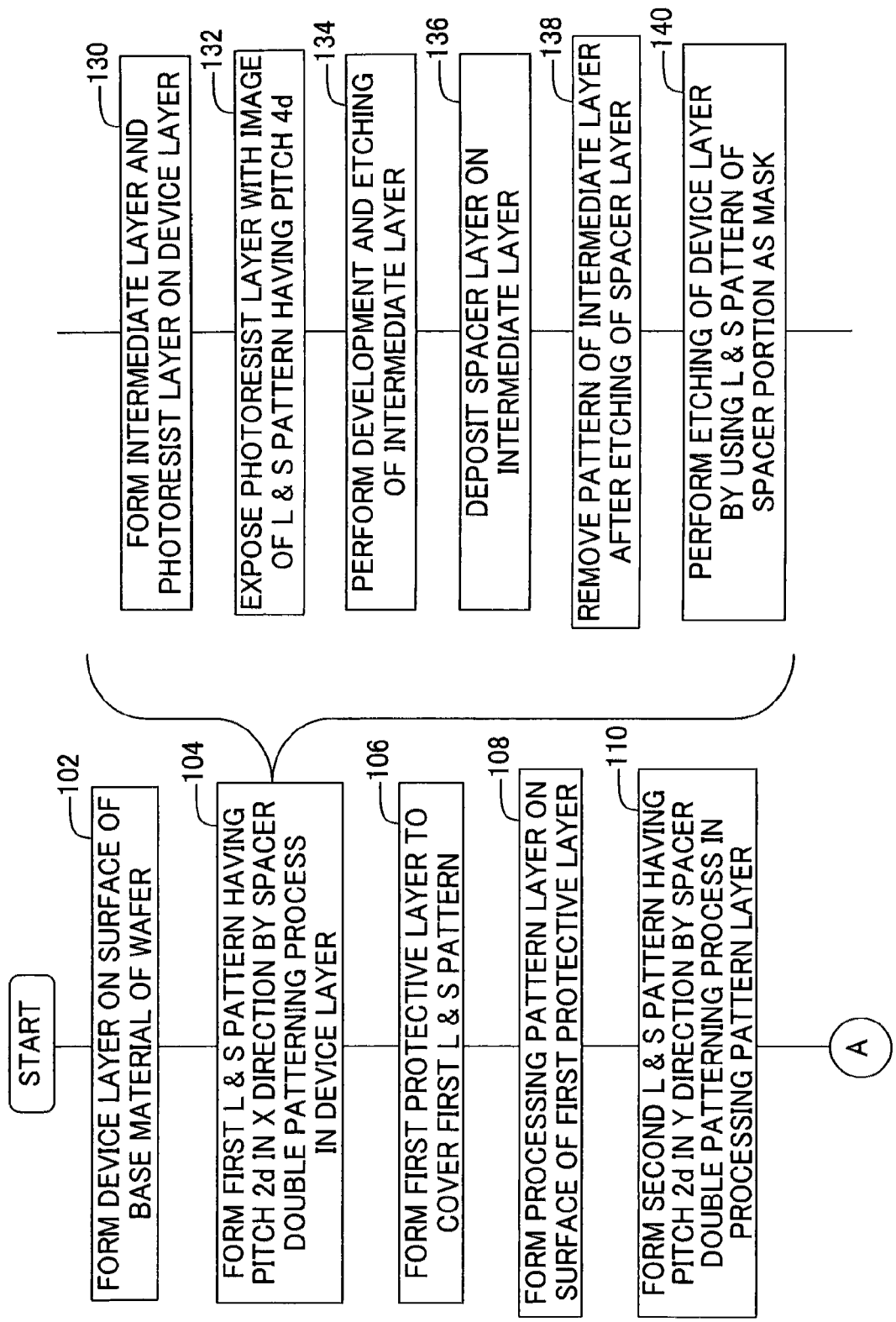
FIG. 3 (FIGS. 3A, 3B) shows a flow chart illustrating a pattern forming method according to a first embodiment.
Figure 3B:
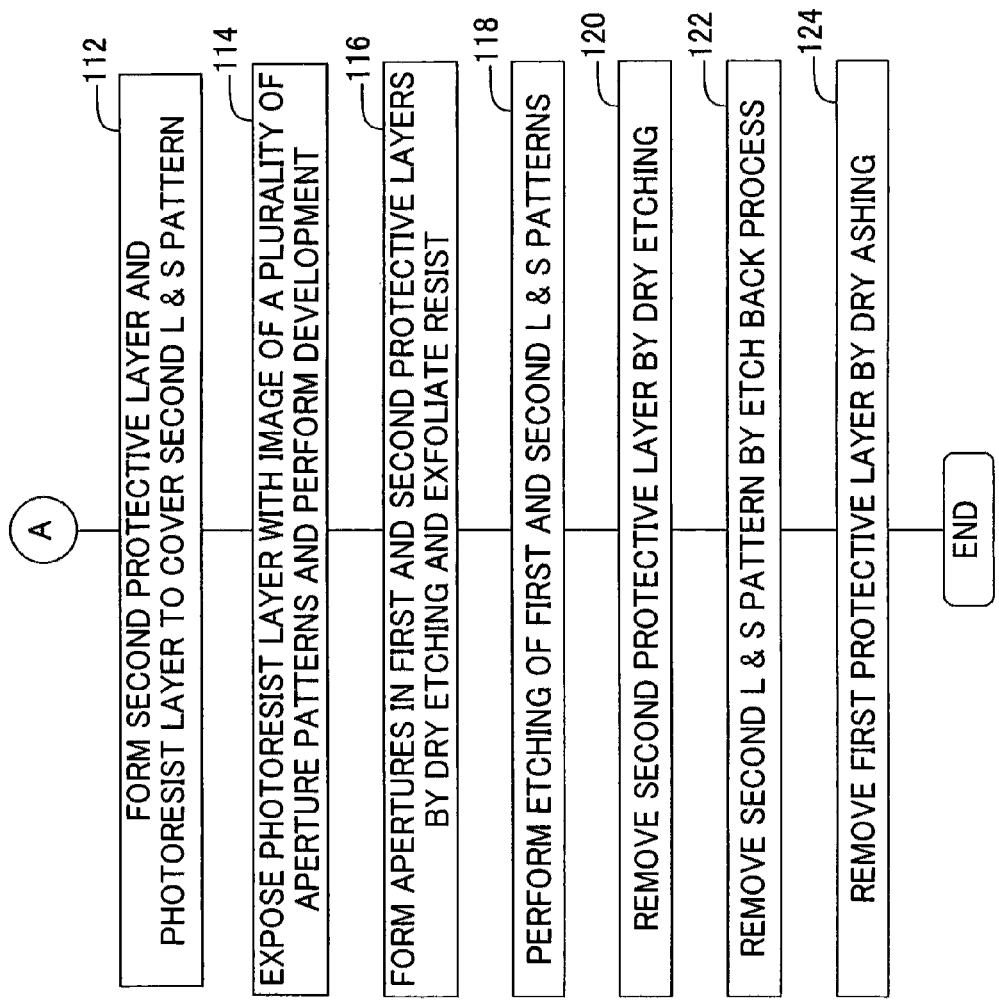

An explanation will be made below with reference to a flow chart shown in FIG. 3 (FIGS. 3A, 3B) about an example of the pattern forming method for forming the circuit pattern 70 by using the pattern forming system of this embodiment. In this embodiment, at the first stage, the first L & S pattern 71 having the line width d (pitch 2d) is formed in each of shot areas on the surface of the wafer by using the spacer double patterning process (Spacer transfer Process or Sidewall transfer Process). At the second stage, the second L & S pattern 78 having the line width d (pitch 2d) is formed to be perpendicular to the first L & S pattern 71 on the first L & S pattern 71 by using the spacer double patterning process in each of the shot areas. At the third stage, the separation portions 74A to 74F (cutouts) having the width d are provided for the plurality of line patterns 72 of the first L & S pattern 71 via the plurality of space portions 79 of the second L & S pattern 78 in each of the shot areas. The first stage corresponds to Steps 102, 104 shown in FIG. 3, the second stage corresponds to Steps 106 to 110, and the third stage corresponds to Steps 112 to 124.

Figure 4A:
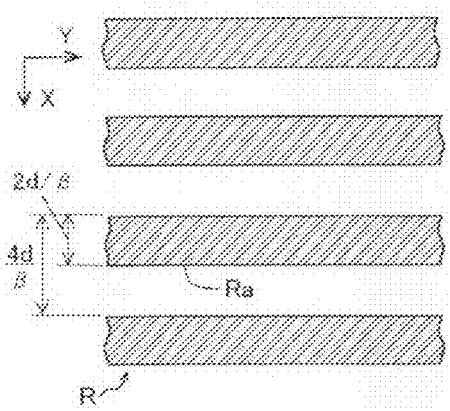
FIG. 4A shows an enlarged plan view of a part of a pattern of a first reticle.
Figure 4G:
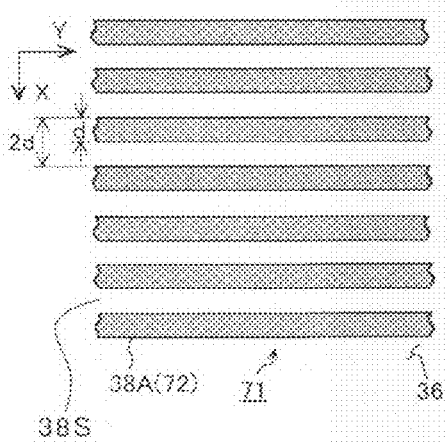
FIG. 4G shows an enlarged plan view of a first L & S pattern (line-and-space pattern) 71 formed in the device layer.
Figure 4B:
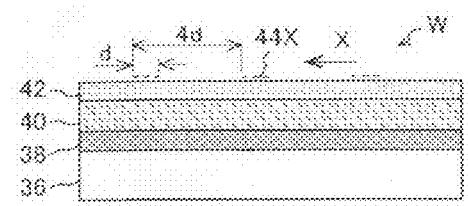
FIG. 4B shows an enlarged sectional view of a wafer W of the first embodiment in which a first intermediate layer and a photoresist layer are formed in a device layer.

At first, as shown in FIG. 4B, a device layer 38, which is composed of a thin film of silicon dioxide ($SiO_2$), is formed on the flat surface of the base material 36 composed of, for example, silicon of the wafer W by using the thin film forming apparatus 300 in Step 102 shown in FIG. 3. For example, an oxide film or a nitride film may be formed on the bottom surface of the device layer 38 (surface of the base material 36). Subsequently, in Step 104, the first L & S pattern 71 having the pitch 2d is formed in the X direction by the spacer double patterning process on the device layer 38. The operation of Step 104 is divided into Steps 130 to 140.

That is, in Step 130, as shown in FIG. 4B, a first intermediate layer 40 is formed on a surface of the device layer 38 of the wafer W by using the thin film forming apparatus 300. For example, a positive type photoresist layer 42 is formed on a surface of the intermediate layer 40 by the coater/developer 200. Subsequently, in Step 132, the wafer W is placed on the wafer stage WST of the liquid immersion type exposure apparatus 100 shown in FIG. 1B. As shown in an enlarged view in FIG. 4A, the pattern of the reticle R (first mask plate) of the exposure apparatus 100 is such an L & S pattern that line patterns Ra, each of which is composed of a light shielding film having a line width of 2d/β (β is the projection magnification), are arranged at a pitch 4d/β in the X direction. The respective shot areas of the wafer W are exposed with an image 44X of the pattern of the reticle R (image of the L & S pattern having the pitch 4d in the X direction) by the exposure apparatus 100. The line width (half pitch) of the image 44X is 2d (approximately equal to the resolution limit). Therefore, the image 44X can be imaged highly accurately by the exposure apparatus 100. In this procedure, the exposure amount is set such that the width in the X direction is d for a portion (unexposed portion) in which the exposure amount is not more than the photosensitive level, in relation to the image 44X corresponding to the amount of one pitch.

Figure 4C:
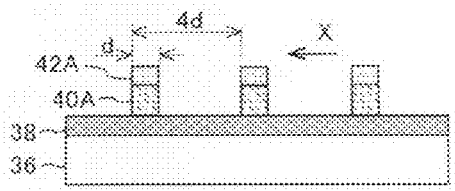
FIG. 4C shows an enlarged sectional view of the wafer after the etching of the first intermediate layer.
Figure 4D:
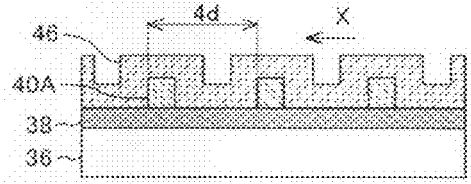
FIG. 4D shows an enlarged sectional view of the wafer W on which a first spacer layer is deposited.
Figure 4E:
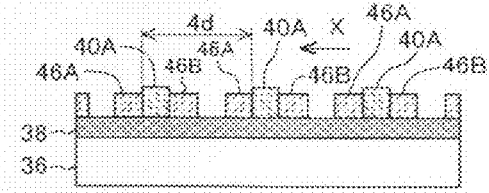
FIG. 4E shows an enlarged sectional view of the wafer W after the etching of the first spacer layer.
Figure 4F:
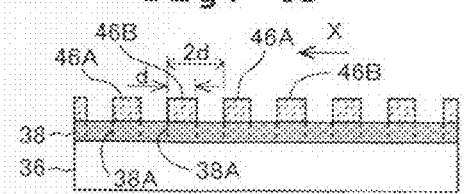
FIG. 4F shows an enlarged sectional view of the wafer W after removing the pattern of the first intermediate layer.

Subsequently, in Step 134, the photoresist layer 42 of the wafer W is developed by the coater/developer 200, and the etching is performed for the intermediate layer 40 of the wafer W by the etching apparatus 400. Accordingly, as shown in FIG. 4C, an L & S pattern is formed, in which a resist pattern 42A having a line width d and a line pattern 40A of the intermediate layer 40 are arranged at a pitch 4d in the X direction. After that, the resist pattern 42A is exfoliated (peeled off). Subsequently, in Step 136, as shown in FIG. 4D, a spacer layer 46 is deposited to cover the line pattern 40A of the intermediate layer 40 of the wafer W by the thin film forming apparatus 300. The process proceeds to Step 138. In the etching apparatus 400, as shown in FIG. 4E, the anisotropic etching is performed in the direction perpendicular to the surface of the spacer layer 46 of the wafer. By doing so, spacer portions 46A, 46B of the spacer layer 46, each of which has a width d, are allowed to remain on the both side surfaces in the X direction of the line pattern 40A of the intermediate layer 40 having the line width d. After that, for example, the line pattern 40A of the intermediate layer 40 of the wafer W is removed by the etching apparatus 400. Accordingly, as shown in FIG. 4F, an L & S pattern is formed, in which the spacer portions 46A, 46B having the line width d are arranged at the pitch 2d in the X direction on the surface of the device layer 38. Subsequently, in Step 140, the etching is performed for the device layer 38 by using, as the mask, the L & S pattern composed of the spacer portions 46A, 46B by the etching apparatus 400 so as to remove the spacer portions 46A and 46B. As a result, as shown in FIGS. 4F and 4G (enlarged plan view), the first L & S pattern 71 is formed, in which the line patterns 38A (first lines) having the line width d are arranged at the pitch 2d in the X direction in the device layer 38 on the surface of the base material 36 of the wafer W (space patterns 38S (first spaces) are each defined between adjacent line patterns 38A). The line pattern 38A corresponds to the line pattern 72 shown in FIG. 2. The alignment marks (not shown) are also formed together with the L & S pattern 71.

Subsequently, in Step 106, as shown in FIG. 5B, a first protective layer 48, which is composed of BARC (Bottom Anti-Reflection Coating) as an antireflection film formed generally on the lower surface of the photoresist, is formed to cover the first L & S pattern 71 of the wafer W by the thin film forming apparatus 300, and the surface thereof is made flat. Subsequently, in Step 108, a processing pattern layer 52, which has the same thickness as that of the device layer 38 and which is composed of the same material (silicon dioxide in this case) as that of the device layer 38, is formed on a surface of the first protective layer 48. The thickness of the processing pattern layer 52 may be different from the thickness of the device layer 38. Subsequently, in Step 110, the second L & S pattern 78 having the pitch 2d in the Y direction is formed in the processing pattern layer 52 by the spacer double patterning process in the same manner as in Step 104. The operation of Step 110 is also divided into the steps corresponding to Steps 130 to 140.

That is, in a step corresponding to Step 130, as shown in FIG. 5B, a second intermediate layer 50 is formed on the surface of the processing pattern layer 52 of the wafer W. For example, a positive type photoresist layer 54 is formed on the surface of the intermediate layer 50. Subsequently, in a step corresponding to Step 132, the wafer W is placed on the wafer stage WST of the exposure apparatus 100. A second reticle R1 (second mask plate) is loaded on the reticle stage RST of the exposure apparatus 100, instead of the reticle R. As shown in an enlarged view in FIG. 5A, the pattern of the reticle R1 is such an L & S pattern that line patterns R1a, each of which is composed of a light shielding film having a line width of $2d/\beta$ ($\beta$ is the projection magnification), are arranged at a pitch of $4d/\beta$ in the Y direction. Alignment marks (not shown), which are formed on the reticle R1, are measured for the reticle R1, and the position of the reticle R1 is adjusted based on the measurement result. After that, the respective shot areas of the wafer W are exposed with an image 44Y of the pattern of the reticle R1 (image of the L & S pattern having the pitch 4d in the Y direction) by the exposure apparatus 100. The line width (half pitch) of the image 44Y is also 2d (approximately equal to the resolution limit). Therefore, the image 44Y can be also imaged highly accurately by the exposure apparatus 100. In this procedure, the exposure amount is set such that the width in the Y direction is d for a portion (unexposed portion) in which the exposure amount is not more than the photosensitive level, in relation to the image 44Y corresponding to the amount of one pitch.

Subsequently, in a step corresponding to Step 134, the photoresist layer 54 of the wafer W is developed, and the etching is performed for the intermediate layer 50. By doing so, as shown in FIG. 5C, an L & S pattern is formed, in which a resist pattern 54A and a line pattern 50A of the intermediate layer 50, each having a line width d are arranged at a pitch 4d in the Y direction. After that, the resist pattern 54A is exfoliated. Subsequently, in a step corresponding to Step 136, as shown in FIG. 5D, a spacer layer 56 is deposited to cover the line pattern 50A of the wafer W. In a step corresponding to Step 138, as shown in FIG. 5E, the anisotropic etching is performed in the direction perpendicular to the surface of the spacer layer 56 of the wafer. Accordingly, spacer portions 56A, 56B of the spacer layer 56, each of which has a width d, are allowed to remain on the both side surfaces in the Y direction of the line pattern 50A having the line width d. After that, the line pattern 50A' of the wafer W is removed. By doing so, as shown in FIG. 5F, an L & S pattern is formed, in which the spacer portions 56A, 56B having the line width d are arranged at the pitch 2d in the Y direction on the surface of the processing pattern layer 52. Subsequently, in a step corresponding to Step 140, the etching is performed for the processing pattern layer 52 by using, as the mask, the L & S pattern composed of the spacer portions 56A, 56B and then the spacer portions 56A and 56B are removed. By doing so, as shown in FIGS. 5F and 5G (enlarged plan view), the second L & S pattern 78 is formed, in which the line patterns 52A having the line width d are arranged at the pitch 2d in the Y direction in the processing pattern layer 52 on the surface of the first protective layer 48 of the wafer W (space patterns 52S (second spaces: corresponding to the space portions 79) are each defined between adjacent line patterns 52A). The line pattern 52A corresponds to the line pattern 77 shown in FIG. 2.

An explanation will be made below with reference to FIGS. 6A to 12C about the process of the formation of the pattern in the first area 76A including the separation portions 74A, 74B in the circuit pattern 70 shown in FIG. 2. FIGS. 6A to 12A show enlarged plan views illustrating the portion corresponding to the first area 76A in each of the shot areas on the surface of the wafer W respectively. FIGS. 6B to 12B show sectional views taken along lines BB' shown in FIGS. 6A to 12A respectively. FIGS. 6C to 12C show sectional views taken along lines CC' shown in FIGS. 6A to 12A respectively. In FIGS. 6A to 9A, the second protective layer 58 and the photoresist layer 60 described later on are depicted as transparent members.

At first, in Step 112 shown in FIG. 3, as shown in FIG. 6B, the second protective layer 58 composed of BARC (Bottom Anti-Reflection Coating) is formed to cover the second L & S pattern 78 of the wafer W by using the thin film forming apparatus 300, and the surface thereof is made flat. Further, for example, the positive type photoresist layer 60 is formed on a surface of the second protective layer 58 by using the coater/developer 200. Subsequently, in Step 114, the wafer W is placed on the wafer stage WST of the exposure apparatus 100 shown in FIG. 1B. A third reticle R3 (third mask plate) is loaded on the reticle stage RST of the exposure apparatus 100, instead of the reticle R1. The reticle R3 is formed with aperture patterns in order to form an image having a size to include the respective separation portions 74A to 74B corresponding to the separation portions 74A to 74F shown in FIG. 2. As shown in an enlarged view in FIG. 6D, for example, two aperture patterns R3a, R3b, in which the widths in the X direction and the Y direction are $2d/\beta$ ($\beta$ is the projection magnification) and the spacing distance in the Y direction is $2d/\beta$, are formed in the light shielding film. In this embodiment, the square shapes are depicted as the shapes of the two aperture patterns R3a, R3b. However, there is no limitation to this. For example, patterns, to which OPC (Optical proximity correction) process is applied, may be used as the two aperture patterns.

Figure 7A:
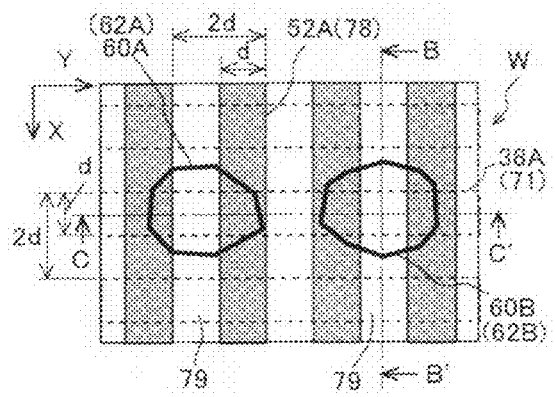
FIG. 7A shows an enlarged plan view of a part of the wafer W after the development.
Figure 7B:
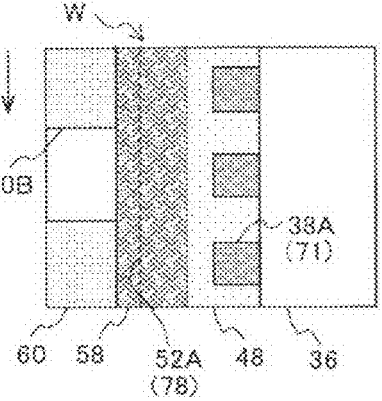
FIG. 7B shows a sectional view taken along a line BB' shown in FIG. 7A.
Figure 7C:
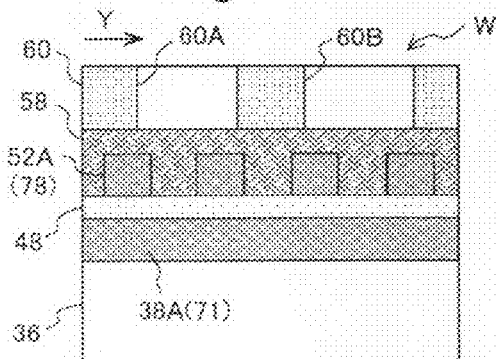
FIG. 7C shows a sectional view taken along a line CC' shown in FIG. 7A.

Alignment marks (not shown) formed for the reticle R3 are measured for the reticle R3, and the position of the reticle R3 is adjusted based on the measurement result. After that, as shown in FIG. 6A, a portion corresponding to the first area 76A of each of the shot areas of the wafer W is exposed with the images 62A, 62B of the aperture patterns R3a, R3b of the reticle R3 by the exposure apparatus 100. For the purpose of convenience of explanation, it is assumed that the image formed by the projection optical system PL is an erecting image. Ideal shapes A1, B1 of the images 62A, 62B are squares in which the widths in the X direction and the Y direction are 2d; and the resolution limit of the exposure apparatus 100 is 2d. However, the aperture patterns R3a, R3b are isolated patterns. Therefore, FIG. 6A shows a state in which the images 62A, 62B are deformed to some extent. For example, if the surface of the wafer W is deviated or shifted from the image plane of the projection optical system (if the images of the aperture patterns R3a, R3b are defocused with respect to the surface of the wafer W), the images of the aperture patterns R3a, R3b (contour portions traversing the photosensitive level of the photoresist) are further deformed as depicted by images A2, B2. However, the positional deviation and the deformation are permitted for the images of the aperture patterns R3a, R3b within a range covering the separation portions 74A, 74B having the widths in the X direction and the Y direction of d. Note that it is appreciated from FIG. 6A that each of the separation portions 74A, 74B are an area in which the space pattern 52S of the second the second L & S pattern 78 and the line pattern 38A of the first L & S pattern 71 are overlapped. After that, the photoresist layer 60 of the wafer W is developed in the coater/developer 200. Accordingly, as shown in FIGS. 7A to 7C, first apertures 60A, 60B are formed at portions corresponding to the images 62A, 62B of the photoresist layer 60 of the wafer W.

Figure 8A:
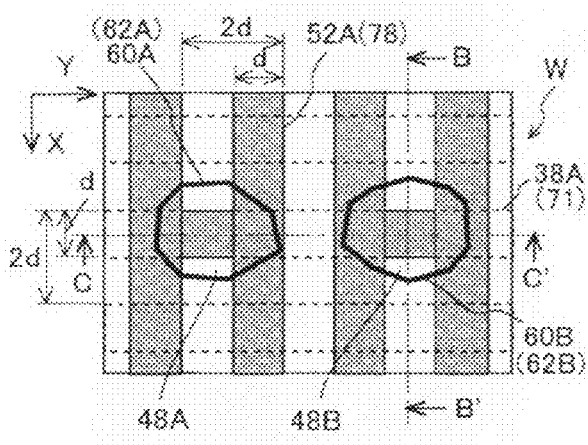
FIG. 8A shows an enlarged plan view of a part of the wafer W in which apertures are formed in a protective layer.
Figure 8B:
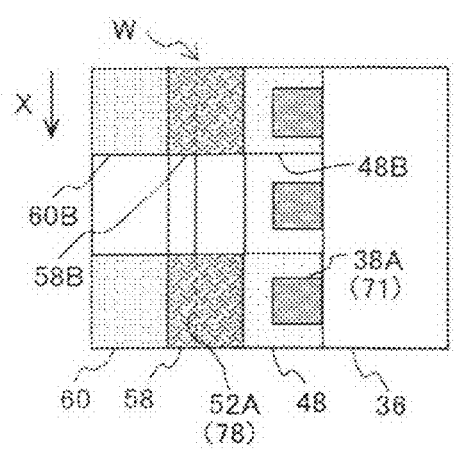
FIG. 8B shows a sectional view taken along a line BB' shown in FIG. 8A.
Figure 8C:
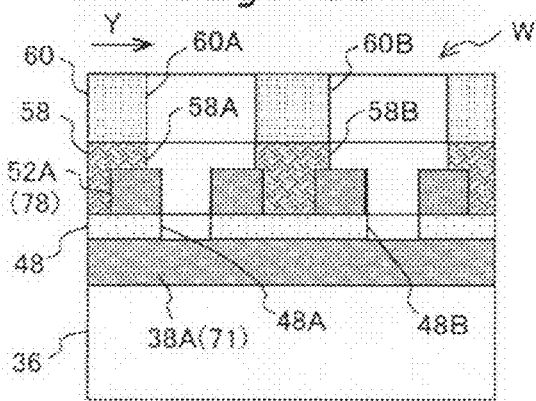
FIG. 8C shows a sectional view taken along a line CC' shown in FIG. 8A.
Figure 9A:
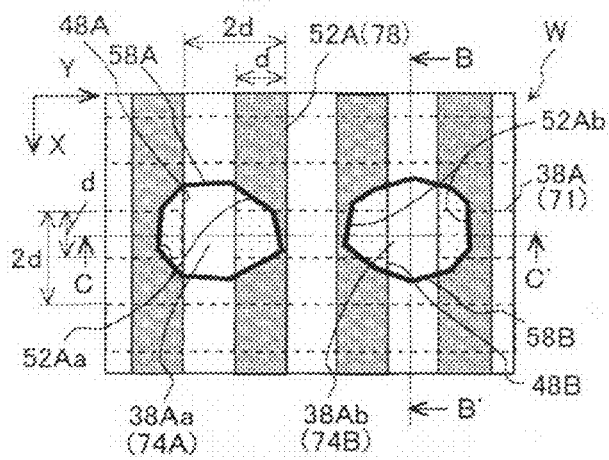
FIG. 9A shows an enlarged plan view of a part of the wafer W in which a part of a L & S pattern 71 and a part of a L & S pattern 78 are removed.
Figure 9B:
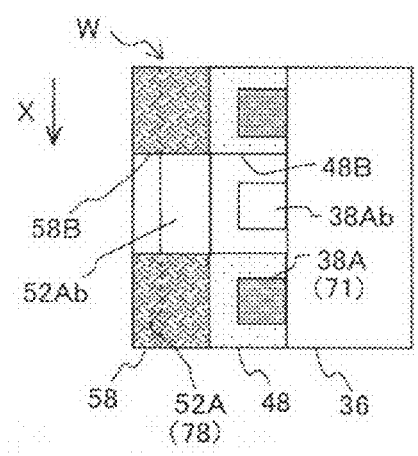
FIG. 9B shows a sectional view taken along a line BB' shown in FIG. 9A.
Figure 9C:
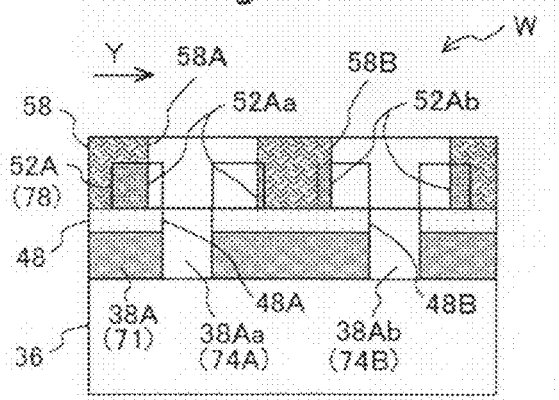
FIG. 9C shows a sectional view taken along a line CC' shown in FIG. 9A.

Subsequently, in Step 116, apertures are formed in the second protective layer 58 and the first protective layer 48 of the wafer W via the apertures 60A, 60B by, for example, the dry etching by using the etching apparatus 400. By doing so, as shown in FIGS. 8A to 8C, third apertures 58A, 58B of the second protective layer 58 (having the same shapes as those of the apertures 60A, 60B) and second apertures 48A, 48B of the first protective layer 48 are formed. The apertures 48A, 48B have areas which is restricted in the Y direction by the adjacent (adjoining) line patterns 52A and is restricted in the X direction by the images 62A, 62B. A part of the line pattern 38A (portion to be removed) exists in the area. Namely, it is appreciated that the second apertures 48A, 48B of the first protective layer 48 are formed by performing etching with end portions of a pair of line patterns (the second lines) 52A of the second L & S line pattern 78 as the boundary, namely with the pair of line patterns (second lines) 52A as the mask. After that, the photoresist layer 60 (resist) is exfoliated or peeled off. Subsequently, in Step 118, the thin films of silicon dioxide forming the second L & S pattern 78 (line pattern 52A) and the first L & S pattern 71 (line pattern 38A) are subjected to the etching via (by the aid of) the apertures 58A, 58B and the apertures 48A, 48B of the wafer W by the etching apparatus 400. By doing so, as shown in FIGS. 9A to 9C, cutouts 52Aa, 52Ab are formed in the line patterns 52A in the apertures 58A, 58B, and cutouts 38Aa, 38Ab are formed at portions corresponding to the separation portions 74A, 74B of the line patterns 38A in the apertures 48A, 48B. Accordingly, it is appreciated that the cutouts 38Aa, 38Ab are formed with the portions (on the wall side), of the first protective layer 48, defining the second apertures 48A, 48B and the pair of line patterns (second lines) 52A, of the second L & S pattern 48, existing above the wall-side portions of the first protective layer 48, as the mask.

Figure 10A:
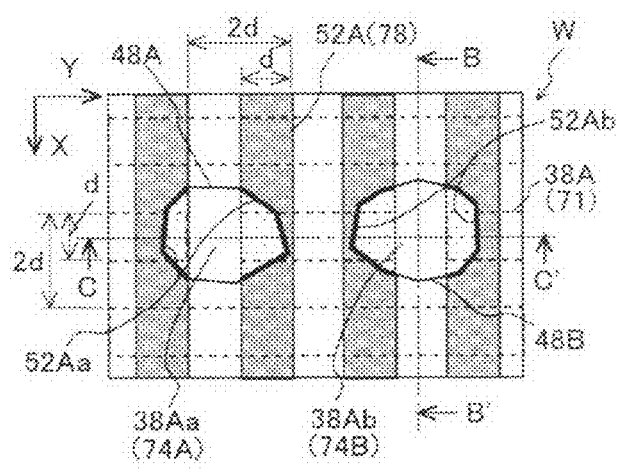
FIG. 10A shows an enlarged plan view of a part of the wafer W after removing a second protective layer.
Figure 10B:
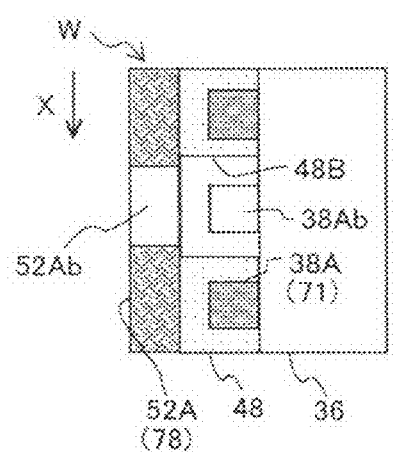
FIG. 10B shows a sectional view taken along a line BB' shown in FIG. 10A.
Figure 10C:
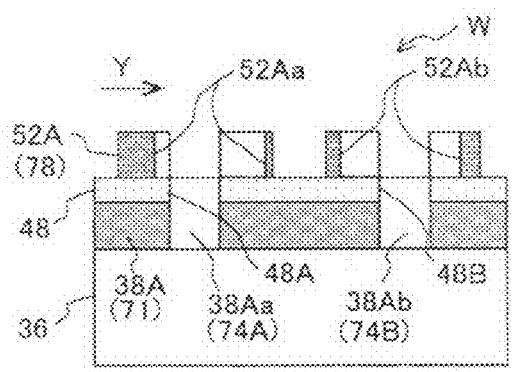
FIG. 10C shows a sectional view taken along a line CC' shown in FIG. 10A.
Figure 11A:
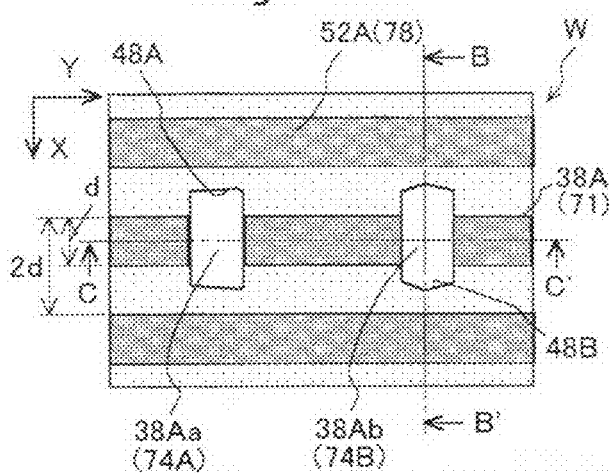
FIG. 11A shows an enlarged plan view of a part of the wafer W after removing the second L & S pattern 78.
Figure 11B:
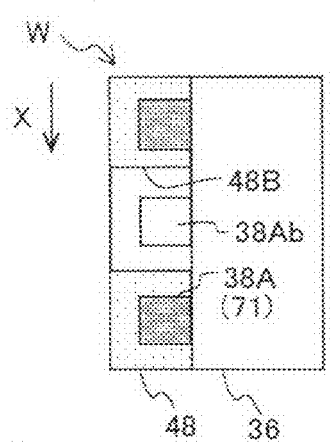
FIG. 11B shows a sectional view taken along a line BB' shown in FIG. 11A.
Figure 11C:
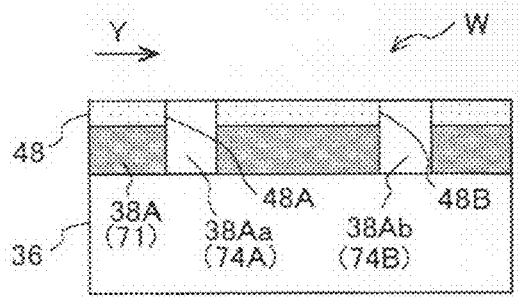
FIG. 11C shows a sectional view taken along a line CC' shown in FIG. 11A.
Figure 12A:
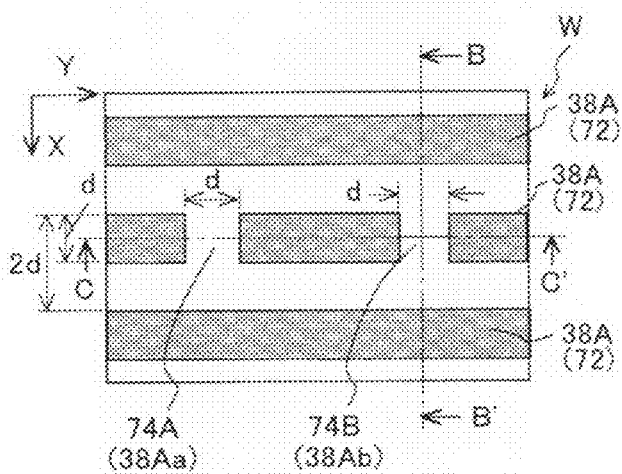
FIG. 12A shows an enlarged plan view of a part of the wafer W after removing the first protective layer.
Figure 12B:
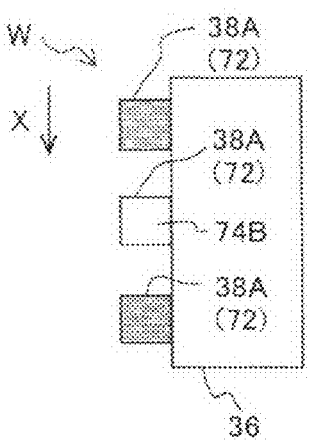
FIG. 12B shows a sectional view taken along a line BB' shown in FIG. 12A.
Figure 12C:
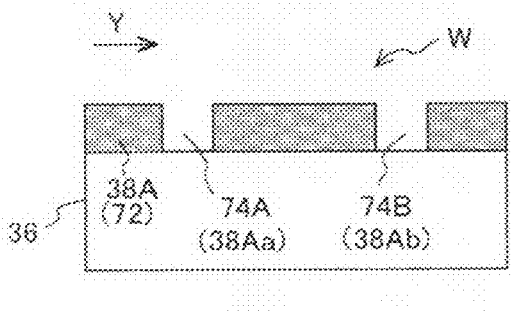
FIG. 12C shows a sectional view taken along a line CC' shown in FIG. 12A.

Subsequently, in Step 120, as shown in FIGS. 10A to 10C, the second protective layer 58 (BARC of the upper layer) of the wafer W is removed, for example, by the dry etching by using the etching apparatus 400. In Step 122, as shown in FIGS. 11A to 11C, the remaining portion of the second L & S pattern 78 (line pattern 52A) of the wafer W is removed, for example, by the etch back process by using the etching apparatus 400. In Step 124, the remaining portion of the first protective layer 48 (BARC of the lower layer) is removed by the dry ashing, for example, by using the ashing apparatus (not shown). As a result, as shown in FIGS. 12A to 12C, the circuit pattern is obtained, in which the line pattern 38A is formed with the cutouts 38Aa, 38Ab having the width d in the Y direction at the portions corresponding to the separation portions 74A, 74B. By regarding the line pattern 38A as the line pattern 72, the circuit pattern is the same as the circuit pattern in the first area 76A shown in FIG. 2.

When the circuit pattern in the first area 76A of the circuit pattern 70 is formed, the circuit pattern in the second area 76B and the circuit pattern having the separation portions 74E, 74F adjacent at the minimum spacing distance d in the Y direction in the third area 76C are also formed concurrently. The former circuit pattern in the second area 76B is the same as the circuit pattern in the first area 76A. Therefore, any explanation of the formation process thereof is omitted. In order to form the circuit pattern in the third area 76C, for example, as shown in FIG. 13D, a slender or elongated (slotted hole-shaped) aperture pattern R3c, in which the width in the X direction is 2d/β and the width in the Y direction is 4d/β, is formed at a portion, corresponding to the third area 76C, of the third reticle R3 loaded on the exposure apparatus 100. In this embodiment, the oblong or rectangular shape is depicted as the shape of the aperture pattern R3c. However, there is no limitation to this. For example, a pattern, to which OPC (Optical proximity correction) process is applied, may be used as the aperture pattern.

An explanation will be made below with reference to FIGS. 13A to 16C about the process in which the pattern in the third area 76C is formed. Portions depicted in FIGS. 13A to 16C, which correspond to those shown in FIGS. 6A to 12C, are designated by the same reference numerals, and any detailed explanation of which will be omitted.

Figure 13A:
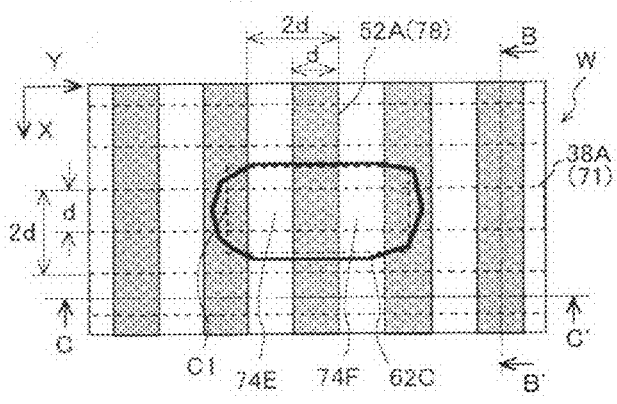
FIG. 13A shows an enlarged plan view of a part of a wafer W exposed with an image of another pattern of a third reticle.
Figure 13B:
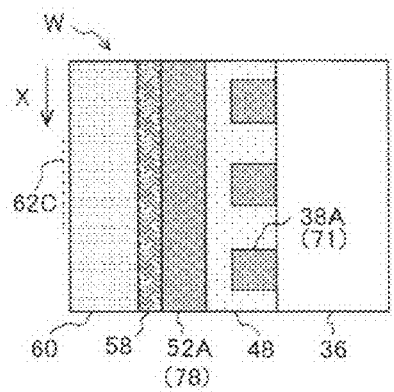
FIG. 13B shows a sectional view taken along a line BB' shown in FIG. 13A.
Figure 13C:
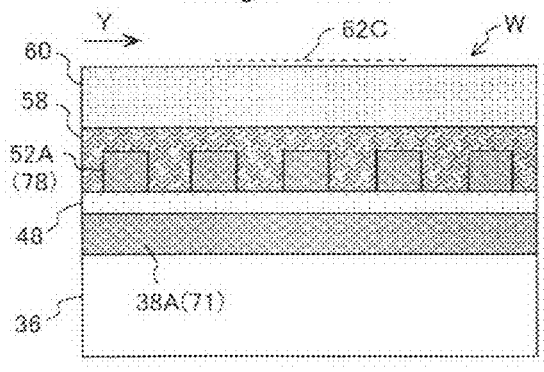
FIG. 13C shows a sectional view taken along a line CC' shown in FIG. 13A.
Figure 13D:
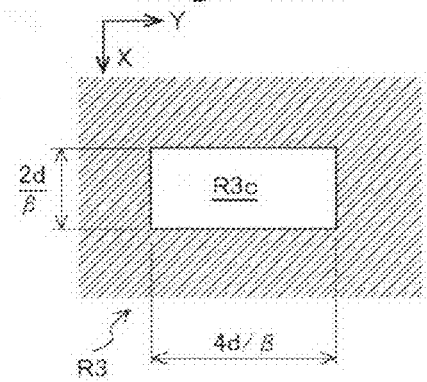
FIG. 13D shows an enlarged plan view of the another pattern of the third reticle.
Figure 14A:
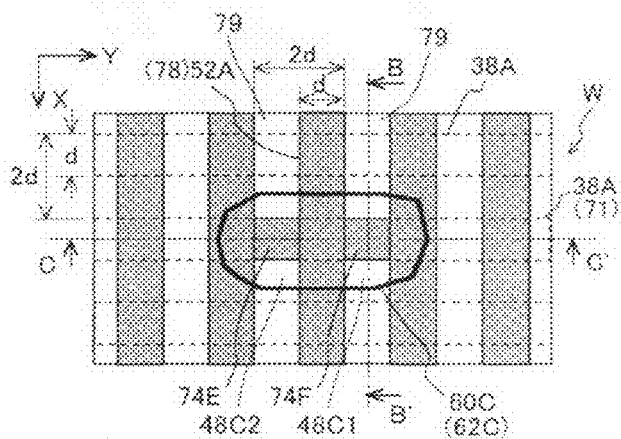
FIG. 14A shows an enlarged plan view of a part of the wafer W in which a part of a photoresist and a part of a protective layer are removed, continuously to the state shown in FIG. 13A.
Figure 14B:
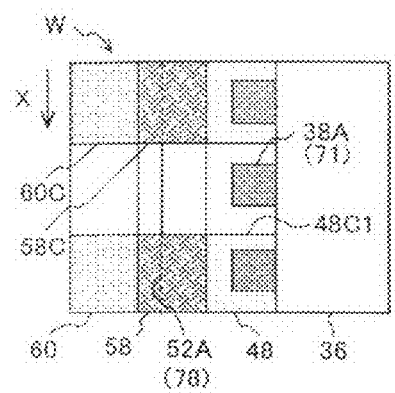
FIG. 14B shows a sectional view taken along a line BB' shown in FIG. 14A.
Figure 14C:
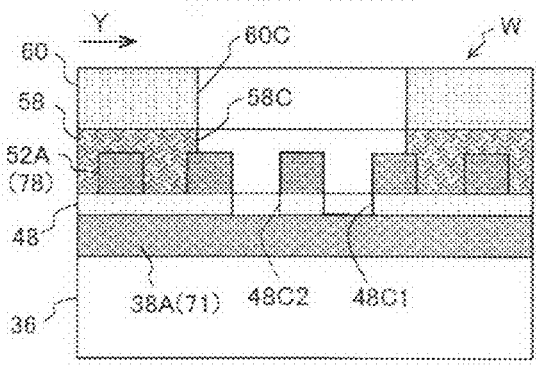
FIG. 14C shows a sectional view taken along a line CC' shown in FIG. 14A.

FIGS. 13A to 16A each show an enlarged plan view of the portion corresponding to the third area 76C in each of the shot areas of the wafer W. FIGS. 13B to 16B show sectional views taken along lines BB' shown in FIGS. 13A to 16A respectively. FIGS. 13C to 16C show sectional views taken along lines CC' shown in FIGS. 13A to 16A respectively. In FIGS. 13A to 16A, the second protective layer 58 and the photoresist layer 60 are depicted as transparent members. At first, in Step 114 shown in FIG. 3, as shown in FIG. 13A, the portion corresponding to the third area 76C of each of the shot areas of the wafer W is exposed with the image 62C of the elongated aperture pattern R3c of the reticle R3 by the exposure apparatus 100. An ideal shape C1 of the image 62C is an oblong in which the width in the X direction is 2d and the width in the Y direction is 4d; and the resolution limit of the exposure apparatus 100 is 2d. However, the aperture pattern R3c is an isolated pattern. Therefore, FIG. 13A shows a state in which the image 62C is deformed to some extent. However, the positional deviation and the deformation are permitted for the image of the aperture pattern R3c within a range covering the separation portions 74E, 74F having the widths in the X direction and the Y direction of d. After that, the photoresist layer 60 of the wafer W is developed. As shown in FIGS. 14A to 14C, a first elongated aperture 60C (portion corresponding to the image 62C) of the photoresist layer 60 is formed. In Step 116, for example by the dry etching, the third aperture 58C is formed in the second protective layer 58 via the first elongated aperture 60C and the second apertures 48C1, 48C2 are formed in the first protective layer 48. As for the third aperture 58C, a part of one line pattern 52A exists at the central portion thereof, and parts of a pair of line patterns exist to interpose one line pattern 52A. The second apertures 48C1, 48C2 have areas in which the Y direction is restricted by the adjacent line patterns 52A and the X direction is restricted by the image of the aperture pattern R3c. As described above, the third aperture 58C is formed in the second protective layer 58, the second apertures 48C1, 48C2 are formed in the first protective layer 48, and then the photoresist layer 60 is exfoliated.

Figure 15A:
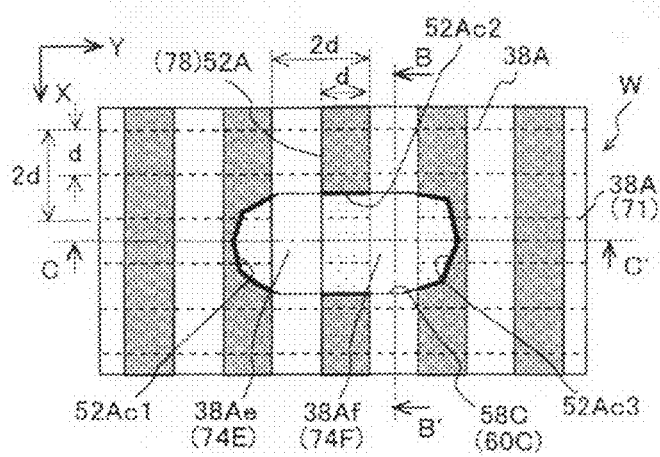
FIG. 15A shows an enlarged plan view of a part of the wafer W in which a part of a L & S pattern 71 and a part of a L & S pattern 78 are removed, continuously to the state shown in FIG. 14A.
Figure 15B:
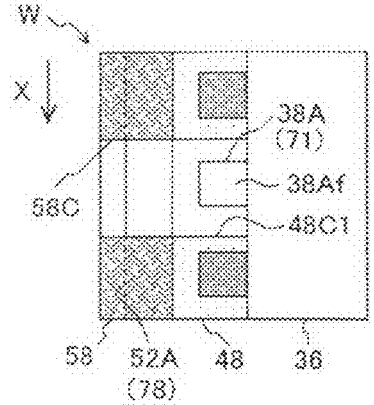
FIG. 15B shows a sectional view taken along a line BB' shown in FIG. 15A.
Figure 15C:
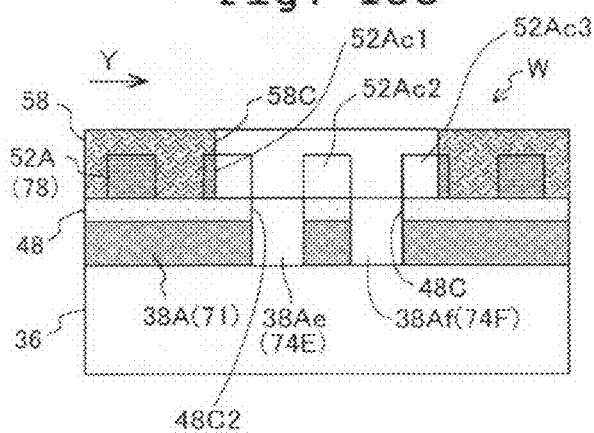
FIG. 15C shows a sectional view taken along a line CC' shown in FIG. 15A.

After that, in Step 118, the thin films of silicon dioxide forming the second L & S pattern 78 (line pattern 52A) and the first L & S pattern 71 (line pattern 38A) are etched via the aperture 58C and the apertures 48C1, 48C2 of the wafer W. By doing so, as shown in FIGS. 15A to 15C, cutouts 52Ac1, 52Ac2, 52Ac3 are formed in the three line patterns 52A in the aperture 58C, and cutouts 38Ae, 38Af are formed at portions corresponding to the separation portions 74E, 74F of the line patterns 38A in the apertures 48C2, 48C1.

Subsequently, in Step 120, the second protective layer 58 of the wafer W is removed, for example, by the dry etching. In Step 122, the remaining portion of the second L & S pattern 78 (line pattern 52A) is removed, for example, by the etch back process. In Step 124, the remaining portion of the first protective layer 48 is removed, for example, by the dry ashing. As a result, as shown in FIGS. 16A to 16C, the circuit pattern is obtained, in which the line pattern 38A is formed with the cutouts 38Ae, 38Af having the width d in the Y direction at the portions corresponding to the separation portions 74E, 74F having the spacing distance d. By regarding the line pattern 38A as the line pattern 72, the circuit pattern is the same as the circuit pattern in the third area 76C shown in FIG. 2.

Therefore, the two separation portions 74E, 74F, which are separated by the spacing distance d along the line pattern 38A (72), can be formed easily and highly accurately by the exposure with the image of one aperture pattern, within the resolution limit, of the reticle R3. Further, the spacing distance d in the Y direction between the separation portions 74E, 74F and the width d in the Y direction of the separation portions 74E, 74F can be easily adjusted by controlling the width d of the space portion 79 and the pitch 2d of the second L & S pattern 78 formed in Step 110.

According to this embodiment, the fine first and second L & S patterns 71, 78 are formed by using the spacer double patterning process at the first stage and the second stage, and then the portions (non-periodic portions) corresponding to the separation portions 74A to 74F are exposed with the images of the corresponding aperture patterns R3a to R3c by the exposure apparatus 100 at the third stage. Further, the cutouts having the width d (separation portions 74A to 74F) are provided for the plurality of line patterns 38A (72) of the first L & S pattern 71 via the plurality of space portions 79 of the second L & S pattern 52A (78) in the apertures formed by the images. Therefore, the circuit pattern 70, which includes the non-periodic portions finer or more minute than the resolution limit of the exposure apparatus 100, can be formed highly accurately by using the exposure apparatus 100.

The effects, etc. of this embodiment are as follows.

(1) The pattern forming method, which uses the pattern forming system including the exposure apparatus 100 according to this embodiment, includes Step 104 of forming the first L & S pattern 71 having the plurality of first line patterns 38A (72) arranged in the X direction on the wafer W, Step 106 of forming the first protective layer 48 to cover the first L & S pattern 71, Step 110 of forming, on the first protective layer 48, the second L & S pattern 78 having such a shape that the plurality of second line patterns 52A (77) extending in the direction perpendicular to the first line patterns 38A are arranged in the Y direction, and Step 112 of forming the second protective layer 58 to cover the second L & S pattern 78 and forming the photoresist layer 60 to cover the second protective layer 58. The pattern forming method further includes Step 114 of forming the pattern having the first apertures 60A, 60B, 60C in the photoresist layer 60 to be overlapped with a part of the second L & S pattern 78, Step 116 of removing a part of the second protective layer 58 and a part of the first protective layer 48 via the apertures 60A to 60C formed in the photoresist layer 60 to form the second apertures 48A, 48B, 48C1, 48C2 in the first protective layer 48, Step 118 of removing a part of the first L & S pattern 71 (separation portions 74A, 74B, 74E, 74F) via the apertures 48A to 48C2 of the first protective layer 48, and Steps 120, 122, 124 of removing the second protective layer 58, the second L & S pattern 78, and the first protective layer 48.

According to this embodiment, the first and second L & S patterns 71, 78 can be formed as the patterns finer than the resolution limit of the exposure apparatus 100 by the spacer double patterning process by using the exposure apparatus 100, because the first and second L & S patterns 71, 78 are the periodic patterns. In this procedure, the (predetermined) space portions 79, which are located at the portions corresponding to the separation portions 74A, 74B, 74E, 74F of the second L & S pattern 78, are positioned to be overlapped with the portions which are to be dealt with as the removal objectives of the first L & S pattern 71. The images to form the apertures 60A to 60C of the photoresist layer 60 are subjected to the exposure to cover the portions to be dealt with as the removal objectives by using the exposure apparatus 100. As a result, the apertures 48A to 48C2 of the first protective layer 48 are formed at the portions at which the apertures 60A to 60C are overlapped with the space portions 79 of the portions to be formed into, for example, the separation portion 74A. Therefore, it is possible to highly accurately remove only the portions to be dealt with as the removal objectives of the first L & S pattern 71 via the apertures 48A to 48C2.

Therefore, it is possible to highly accurately form the circuit pattern 70 including the non-periodic portion (separation portions 74A, 74B) finer than the resolution limit of the exposure apparatus 100 by using the exposure apparatus 100.

(2) Further, the steps of forming the first L & S pattern 71 and the second L & S pattern 78 by applying the spacer double patterning process include Steps 132, 134 of forming the plurality of line patterns 40A having the pitch (4d) which is twice the pitch of the plurality of line patterns 38A and the plurality of line patterns 50A having the pitch (4d) which is twice the pitch of the plurality of line patterns 52A respectively, and Steps 136, 138, 140 of forming the first L & S pattern 71 and the second L & S pattern 78 having the pitch (2d) which is ½ of the pitch of the plurality of line patterns 40A, 50A by using the plurality of line patterns 40A, 50A. Therefore, it is possible to highly accurately form the L & S pattern 71, 78 having the line width (half pitch) until ½ of the resolution limit of the exposure apparatus 100.

(3) Further, each of the first apertures 60A, 60B of the photoresist layer 60 has the size covering at least a part (has a dimension which is not less than the width of the space portion 79 and which is a part (portion) of the length of the space portion 79) of one space portion 79 of the second L & S pattern 78 (see FIG. 7A). Accordingly, it is possible to highly accurately cut out the line pattern 38A of the first L & S pattern 71 at the portion overlapped with the space portion 79. It is also allowable that only one aperture (and consequently the cutout) of the photoresist layer 60 is provided on one line pattern 38A.

(4) Further, the first aperture 60C, which is provided in the photoresist layer 60, has the elongated shape (slotted hole) having the size covering at least parts (straddling the adjacent two space portions 79 and being a part or portion of the length of the space portion 79) of the mutually adjacent two space portions 79 of the second L & S pattern 78 (see FIG. 14A); and the second apertures 48C2, 48C1 of the first protective layer 48 are formed at the positions corresponding to the mutually adjacent two space portions 79. Accordingly, it is possible to easily form the cutouts 38Ae, 38Af at the two portions at the minimum spacing distance d along the line pattern 38A via one aperture 60C of the photoresist layer 60.

(5) Further, the second protective layer 58, which is composed of the antireflection film (BARC), is formed to cover the second L & S pattern 78 between the first protective layer 48 and the photoresist layer 60 (Step 112). When the apertures 48A to 48C2 are formed in the first protective layer 48, the third apertures 58A to 58C are formed in the second protective layer 58 (Step 116). When a part of the first L & S pattern 71 is removed, the etching is performed for the first L & S pattern 71 via the third apertures 58A to 58C, the space portions 79 of the second L & S pattern 78, and the second apertures 48A to 48C2 of the first protective layer 48 (Step 118). Since the space portions 79 of the second L & S pattern 78 are defined by the line patterns 52A of the second L & S pattern 78, a part or portion of the first L & S pattern 71 can be considered as being formed with a part or portion of the line pattern 52A of the second L & S pattern 79 as the mask.

Further, in this embodiment, the first protective layer 48 is also formed of the antireflection film (BARC). In this way, the second protective layer 58 and the first protective layer 48, which are composed of BARC, are used as the hard masks. By doing so, the circuit pattern can be formed inexpensively as compared with a case that any exclusive hard mask is used. Further, since the antireflection film (BARC) is an organic material, the resistance or durability against the etching differs in a case that the L & S patterns 71, 78 are composed of the inorganic material such as silicon dioxide or metal. Therefore, this configuration is especially suitable as the hard mask.

Second Embodiment

Next, a second embodiment of the present teaching will be explained with reference to FIGS. 17 to 24C. Also in this embodiment, the pattern forming system shown in FIG. 1A and the exposure apparatus 100 shown in FIG. 1B are used. The pattern, which is formed in this embodiment, is such a circuit pattern that the protrusions (portions of the line pattern 72 other than the separation portions 74A to 74F) of the circuit pattern 70 shown in FIG. 2 are recesses.

An explanation will be made below with reference to a flow chart shown in FIG. 17 about an example of the pattern forming method using the pattern forming system of this embodiment. Also in this embodiment, at the first stage, a first L & S pattern 71 having a line width d (pitch 2d) is formed in each of shot areas on a surface of a wafer (designated as "wafer W1") by using the spacer double patterning process. At the second stage, a second L & S pattern 78 having a line width d (pitch 2d) is formed to be perpendicular to the first L & S pattern 71 on the first L & S pattern 71 by using the spacer double patterning process in each of the shot areas. At the third stage, separation portions 74A to 74F having a width d are provided in a plurality of line patterns 72 of the first L & S pattern 71 via a plurality of space portions 79 of the second L & S pattern 78 in each of the shot areas, and then the respective line patterns 72 are removed. The first stage corresponds to Steps 102A, 104A, 150, 152 shown in FIG. 17. The second stage corresponds to Steps 108A, 110A. The third stage corresponds to Steps 154 to 166.

Figure 18A:
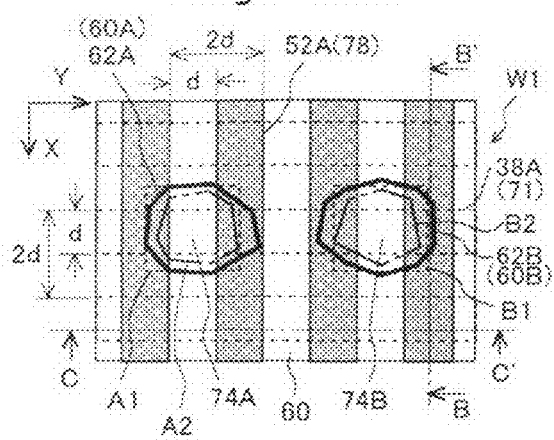
FIG. 18A shows an enlarged plan view of a part of a wafer W1 of the second embodiment exposed with an image of a pattern of a third reticle.
Figure 18B:
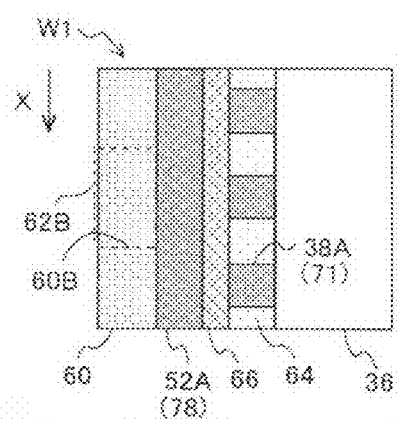
FIG. 18B shows a sectional view taken along a line BB' shown in FIG. 18A.
Figure 18C:
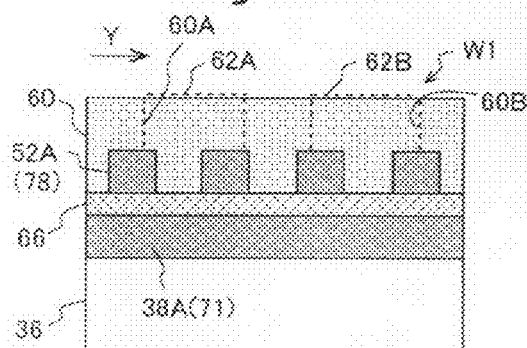
FIG. 18C shows a sectional view taken along a line CC' shown in FIG. 18A.
Figure 18D:
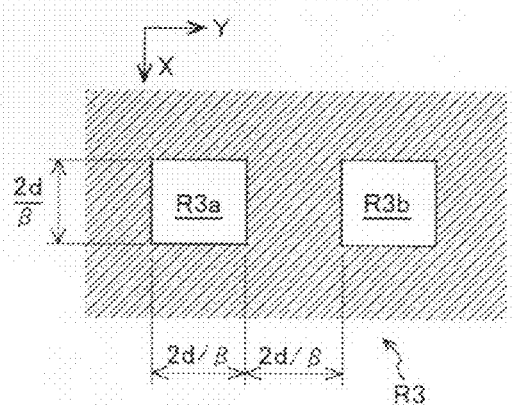
FIG. 18D shows an enlarged plan view of a part of the pattern of the third reticle.

At first, in Step 102A shown in FIG. 17, a device layer (not shown), which is composed of a thin film of silicon dioxide (SiO2), is formed on a flat surface of a base material 36 composed of, for example, silicon of the wafer W1 as shown in FIG. 18B. Subsequently, in Step 104A, the first L & S pattern 71, in which a plurality of line patterns 38A having a line width d are arranged at a pitch 2d in the X direction, is formed in the device layer by the spacer double patterning process in the same manner as in Step 104 shown in FIG. 3. Subsequently, in Step 150, an organic layer 64, which is a thin film composed of an organic material having a low dielectric constant (so-called Low-k organic material), is formed (filled, charged) to fill the space portion of the first L & S pattern 71, and the surfaces of the first L & S pattern 71 and the organic layer 64 are made flat. Those usable as the organic material having the low dielectric constant include, for example, a porous organic silica film (SiOCH) which is a material having a specific inductive capacity (dielectric constant) of, for example, not more than about 4 (may be not more than about 3), and an organic SOG (spin-on glass) material which is a porous organic glass material. The insulation performance can be improved owing to the low dielectric constant. Further, since the material of the first L & S pattern 71 is an organic substance, the resistance or durability against the etching differs between the first L & S pattern 71 and the organic layer 64 which surrounds the first L & S pattern 71.

Subsequently, in Step 152, a hard mask layer 66, which is composed of, for example, an inorganic material such as a nitride film or the like, is formed to cover the first L & S pattern 71 (and the organic layer 64). Subsequently, in Step 108A, a processing pattern layer (not shown), which has the same thickness as that of the device layer and which is composed of the same material (silicon dioxide in this case) as that of the device layer, is formed on a surface of the hard mask layer 66. The thickness of the processing pattern layer may be different from the thickness of the device layer. Subsequently, in Step 110A, a second L & S pattern 78, in which a plurality of line patterns 52A having a line width d are arranged at a pitch 2d in the Y direction, is formed in the processing pattern layer by the spacer double patterning process as shown in FIG. 18A in the same manner as in Step 110 shown in FIG. 3.

An explanation will be made below with reference to FIGS. 18A to 24C about the process of the formation of the pattern corresponding to the pattern in the first area 76A including the separation portions 74A, 74B in the circuit pattern 70 shown in FIG. 2. The portions shown in FIGS. 18A to 24C, which correspond to those shown in FIGS. 6A to 12C, are designated by the same reference numerals, any detailed explanation of which will be omitted. FIGS. 18A to 24A each show an enlarged plan view illustrating the portion corresponding to the first area 76A in each of the shot areas on the surface of the wafer W1. FIGS. 18B to 24B show sectional views taken along lines BB' shown in FIGS. 18A to 24A respectively. FIGS. 18C to 24C show sectional views taken along lines CC' shown in FIGS. 18A to 24A respectively. In FIGS. 18A to 24A, the photoresist layer 60 described later on is depicted as a transparent member.

At first, in Step 154 shown in FIG. 17, as shown in FIG. 18B, for example, the positive type photoresist layer 60 is formed (coated) to cover the second L & S pattern 78 of the wafer W1. Subsequently, in Step 114A, the portion corresponding to the first area 76A of each of the shot areas of the wafer W1 is exposed with the images 62A, 62B of the aperture patterns R3a, R3b, having the width 2d/β of the reticle R3 shown in FIG. 18D as shown in FIG. 18A by the exposure apparatus 100 in the same manner as in Step 114 shown in FIG. 3. After that, the photoresist layer 60 of the wafer W1 is developed, and thus first apertures 60A, 60B are formed at the portions corresponding to the images 62A, 62B (see FIGS. 18B and 18C).

Figure 19A:
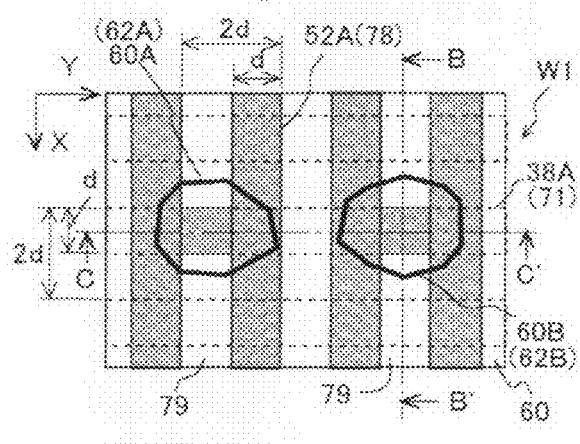
FIG. 19A shows an enlarged plan view of a part of the wafer W1 in which a part of a hard mask layer is removed after the development.
Figure 19B:
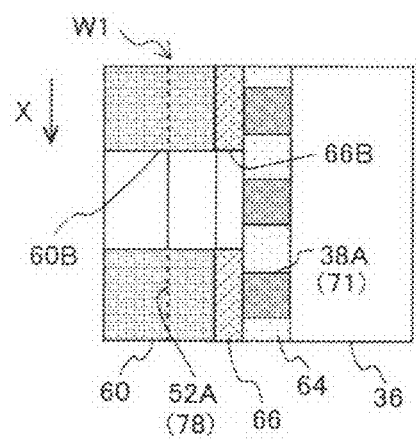
FIG. 19B shows a sectional view taken along a line BB' shown in FIG. 19A.
Figure 19C:
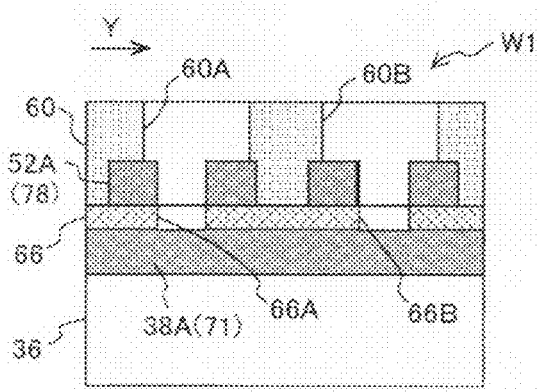
FIG. 19C shows a sectional view taken along a line CC' shown in FIG. 19A.
Figure 20A:
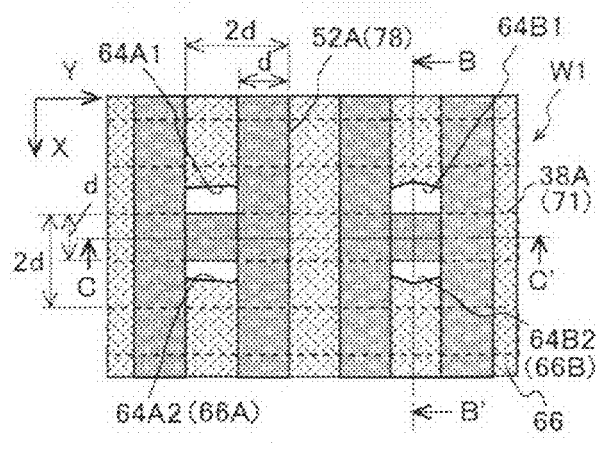
FIG. 20A shows an enlarged plan view of a part of the wafer W1 in which a part of a resist and a part of an organic layer are removed.
Figure 20B:
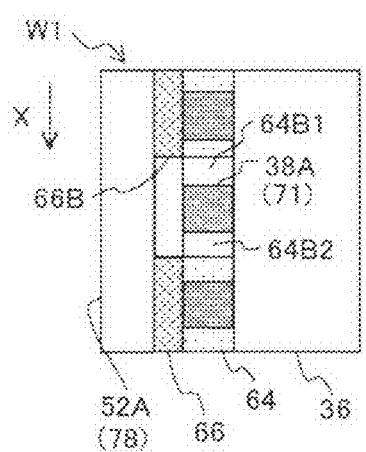
FIG. 20B shows a sectional view taken along a line BB' shown in FIG. 20A.
Figure 20C:
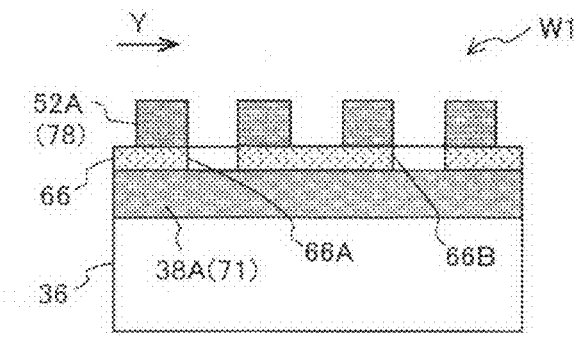
FIG. 20C shows a sectional view taken along a line CC' shown in FIG. 20A.

Subsequently, in Step 156, the hard mask layer 66 of the wafer W1 is etched via the apertures 60A, 60B. By doing so, as shown in FIGS. 19A to 19C, second apertures 66A, 66B of the hard mask layer 66 are formed at the portions (portions ranging over or straddling the line pattern 38A) at which the apertures 60A, 60B are overlapped with the space portion of the second L & S pattern 78. Subsequently, in Step 158, a part of the organic layer 64 is removed via the apertures 66A, 66B, for example, by the dry etching. By doing so, as shown in FIGS. 20A to 20C, first and second space portions, which are disposed while allowing one space portion of the second L & S pattern 78 to intervene therebetween, are processed as follows. That is, a pair of apertures 64A1, 64A2 of the organic layer 64 are formed to interpose the line pattern 38A therebetween in the first space portion; and another pair of apertures 64B1, 64B2 of the organic layer 64 are formed to interpose the line pattern 38A therebetween in the second space portion.

Subsequently, in Step 118A, the etching is performed for the second L & S pattern 78 (silicon dioxide film in this case) and etching is performed for the first L & S pattern 71 (silicon dioxide film in this case) via the apertures 66A, 66B of the hard mask layer 66, in the same manner as in Step 118 shown in FIG. 3. In this procedure, as depicted by broken lines in FIG. 21C, any line pattern 52A of the second L & S pattern 78 is not allowed to remain. Accordingly, as shown in FIGS. 21A to 21C, cutouts 38Aa, 38Ab are formed in the line pattern 38A of the first L & S pattern 71 at the positions corresponding to the separation portions 74A, 74B in the apertures 66A, 66B.

Further, the pair of apertures 64A1, 64A2 and the pair of apertures 64B1, 64B2 shown in FIG. 20A form one aperture 64A and one aperture 64B, respectively.

Figure 22A:
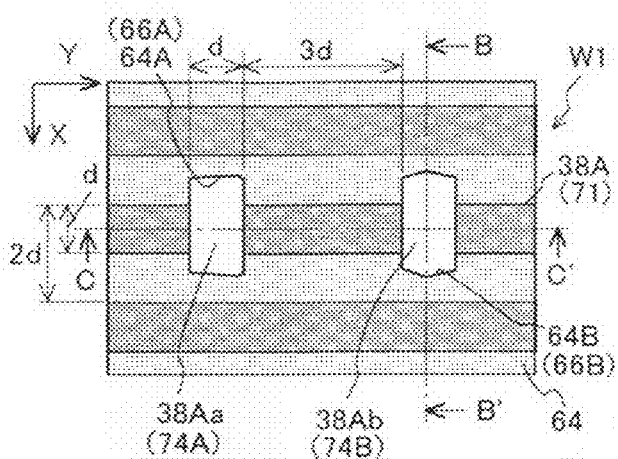
FIG. 22A shows an enlarged plan view of a part of the wafer W1 after removing the hard mask layer.
Figure 22B:
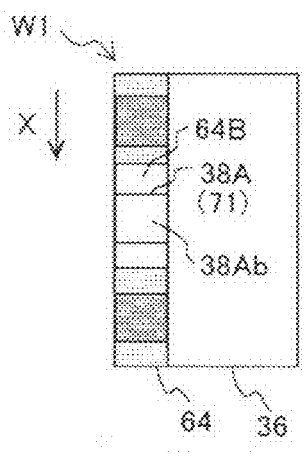
FIG. 22B shows a sectional view taken along a line BB' shown in FIG. 22A.
Figure 22C:
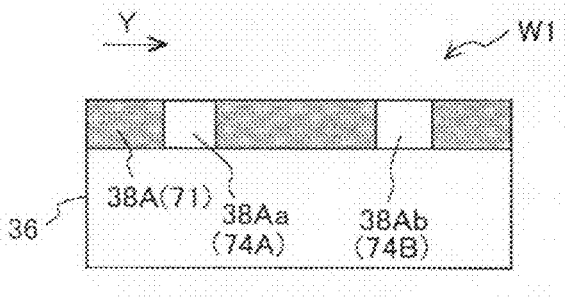
FIG. 22C shows a sectional view taken along a line CC' shown in FIG. 22A.
Figure 23A:
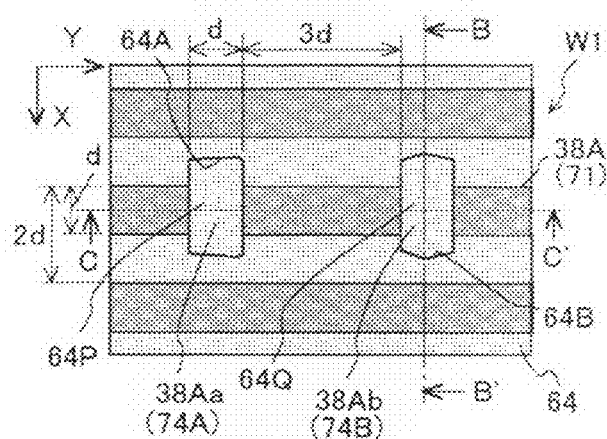
FIG. 23A shows an enlarged plan view of a part of the wafer W1 in which cutouts are re-filled with an organic material.
Figure 23B:
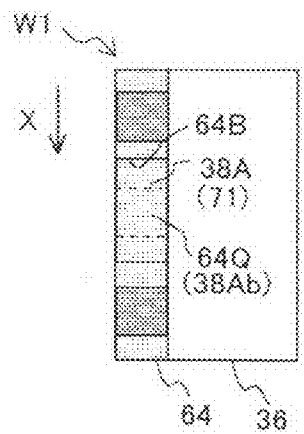
FIG. 23B shows a sectional view taken along a line BB' shown in FIG. 23A.
Figure 23C:
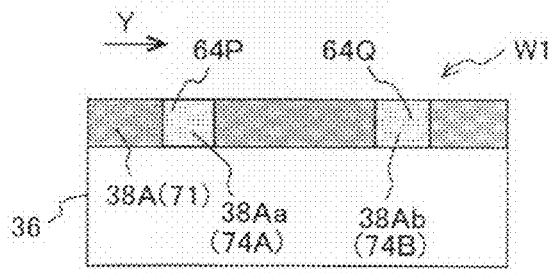
FIG. 23C shows a sectional view taken along a line CC' shown in FIG. 23A.
Figure 24A:
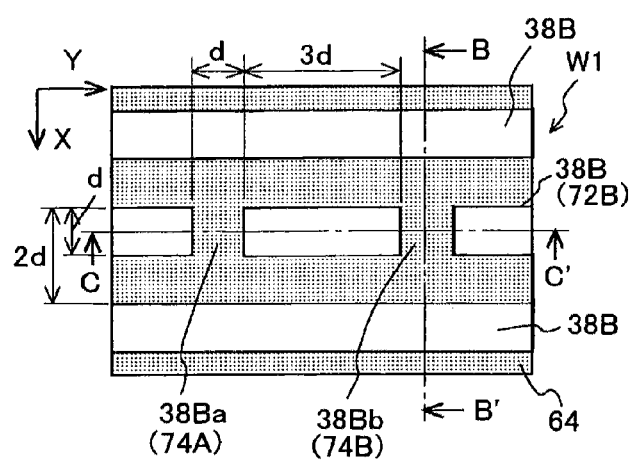
FIG. 24A shows an enlarged plan view of a part of the wafer W1 after removing the first L & S pattern 71.
Figure 24B:
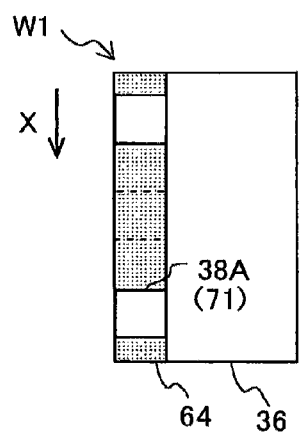
FIG. 24B shows a sectional view taken along a line BB' shown in FIG. 24A.
Figure 24C:
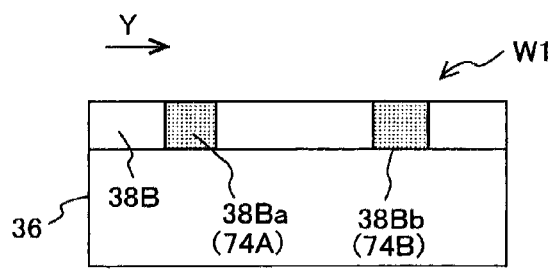
FIG. 24C shows a sectional view taken along a line CC' shown in FIG. 24A.

Subsequently, in Step 160, the hard mask layer 66 is removed, for example, by the etch back process. By doing so, as shown in FIGS. 22A to 22C, the first L & S pattern 71 appears, which includes the line pattern 38A provided with the cutouts 38Aa, 38Ab. Subsequently, in Step 162, as shown in FIGS. 23A to 23C, the cutouts 38Aa, 38Ab of the first L & S pattern 71 are re-filled with filling portions 64P, 64Q composed of an organic material having the same low dielectric constant as that of the organic layer 64, and the surface is made flat. Subsequently, in Step 164, only the first L & S pattern 71 (silicon dioxide film) is removed from the wafer W1 by, for example, the wet etching. By doing so, as shown in FIGS. 24A to 24C, the circuit pattern is formed, wherein the portion, which corresponds to the protruding line pattern 72 in the first area 76A shown in FIG. 2, is regarded as the recessed line pattern 38B (or 72B). Flat portions 38Ba, 38Bb (non-periodic portions finer than the resolution limit of the exposure apparatus 100) having the width d are formed at the positions corresponding to the separation portions 74A, 74B at which the spacing distance in the Y direction is 3d, in the central line pattern 38B. Further, if necessary, in Step 166, it is also allowable to fill the recessed line pattern 38B (recess), for example, with a conductive material such as copper or the like. By doing so, it is possible to form a circuit pattern of the embedded type in which the recessed line pattern 38B is filled with the conductive material.

Further, the circuit pattern corresponding to the patterns in the second area 76B and the third area 76C is also formed in the same manner as described above, together with the circuit pattern corresponding to the pattern in the first area 76A of the circuit pattern 70 shown in FIG. 2.

According to this embodiment, the following effects, etc. are obtained in addition to the effects, etc. of the first embodiment.

(1) The pattern forming method of this embodiment includes Step 104A of forming the first L & S pattern 71 having the plurality of first line patterns 38A arranged in the X direction on the wafer W1, Step 152 of forming the hard mask layer 66 to cover the first L & S pattern 71, Step 110A of forming the second L & S pattern 78 having the shape in which the plurality of second line patterns 52A extending in the direction perpendicular to the line patterns 38A are arranged in the Y direction on the hard mask layer 66, and Step 154 of forming the photoresist layer 60 to cover the second L & S pattern 78. Further, the pattern forming method includes Step 114A of forming the pattern having the first apertures 60A, 60B in the photoresist layer 60 to be overlapped with a part of the second L & S pattern 78, Step 156 of removing a part of the hard mask layer 66 via the apertures 60A, 60B to form the second apertures 66A, 66B in the hard mask layer 66, Step 118A of removing a part (separation portions 74A, 74B) of the first L & S pattern 71 via the apertures 66A, 66B, and Step 160 of removing the hard mask layer 66.

According to this embodiment, the first and second L & S patterns 71, 78 can be formed as the patterns finer or more minute than the resolution limit of the exposure apparatus 100. Further, the images to form the apertures 60A, 60B of the photoresist layer 60 are subjected to the exposure by using the exposure apparatus 100 to cover the portions (separation portions 74A, 74B) to be dealt with as the removal objective of the line pattern 38A of the first L & S pattern 71 at the portion overlapped with the space portion of the second L & S pattern 78. As a result, the apertures 66A, 66B of the hard mask layer 66 are formed at the portions at which the apertures 60A, 60B are overlapped with the separation portion 74A, etc. Therefore, only the portions of the first L & S pattern 71, which are dealt with as the removal objective, can be removed highly accurately via the apertures 66A, 66B.

Therefore, it is possible to form the circuit pattern including the non-periodic portions (separation portions 74A, 74B) finer than the resolution limit of the exposure apparatus 100 highly accurately by using the exposure apparatus 100.

(2) Further, the pattern forming method includes Step 150 of filling the space portion of the first L & S pattern 71 with the organic layer 64 when the first L & S pattern 71 is formed on the wafer W1, Step 162 of filling the removed portions (cutouts 38Aa, 38Ab) in the first L & S pattern 71 with the thin film (filling portions 64P, 64Q) composed of the same material as that of the organic layer 64 after removing the hard mask layer 66 and the second L & S pattern 78, and Step 164 of removing the first L & S pattern 71.

Accordingly, it is possible to form the circuit pattern in which the separation portions 74A, 74B are the flat portions and the portions of the L & S pattern 71 are recesses. Further, a trench pattern can be also formed in the same manner as described above.

(3) Further, the organic layer 64 is the insulating film composed of the organic material having the small dielectric constant, and the hard mask layer 66 is the inorganic film. Therefore, the resistance or durability against the etching differs between the organic layer 64 and the hard mask layer 66. Therefore, it is possible to easily remove only the hard mask layer 66 after forming the apertures 64A, 64B in the organic layer 64.

Third Embodiment

Next, a third embodiment of the present teaching will be explained with reference to FIGS. 25A to 29C. The pattern forming system shown in FIG. 1A and the exposure apparatus 100 shown in FIG. 1B are also used in this embodiment. The pattern, which is formed in this embodiment, is a circuit pattern in the first area 76A in the circuit pattern 70 shown in FIG. 2. An explanation will be made below about an example of the pattern forming method according to this embodiment while making comparison with the operation of the first embodiment (flow chart shown in FIG. 3).

Figure 25A:
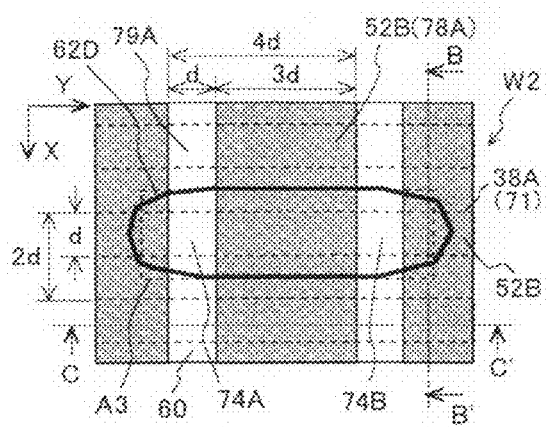
FIG. 25A shows an enlarged plan view of a part of a wafer W2 of a third embodiment exposed with an image of a pattern of a third reticle.
Figure 25B:
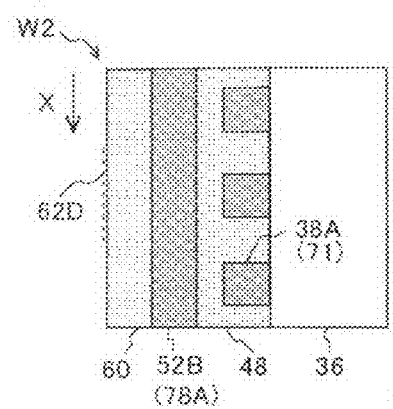
FIG. 25B shows a sectional view taken along a line BB' shown in FIG. 25A.

At first, corresponding to Steps 102, 104 shown in FIG. 3, as shown in FIG. 25B, a first L & S pattern 71, in which a plurality of line patterns 38A (thin film of silicon dioxide) having a line width d are arranged at a pitch 2d in the X direction, is formed on a flat surface of a base material 36 of a wafer (designated as "wafer W2") by the spacer double patterning process. Subsequently, in Step 106, a first protective layer 48 (hereinafter simply referred to as "protective layer 48" in this embodiment), which is composed of an antireflection film (BARC), is formed to cover the first L & S pattern 71 of the wafer W2. Subsequently, corresponding to Step 108, a processing pattern layer 52 (see FIG. 5B) is formed on a surface of the protective layer 48. Subsequently, in a step corresponding to Step 110, the space between the spacer portions 56A, 56B shown in FIG. 5E is also filled with the same material as that of the spacer layer 56. After removing the line pattern 50A, the etching is performed for the processing pattern layer 52. Accordingly as shown in FIG. 25A, a second L & S pattern 78A, in which the space portions 79A having a width d in the Y direction and the line patterns 52B having a width 3d in the Y direction are arranged at a pitch 4d in the Y direction, is formed on the surface of the protective layer 48. In order to form the second L & S pattern 78A, a line pattern having a line width 3d may be formed as the line pattern 50A shown in FIG. 5C in a step corresponding to Step 134 shown in FIG. 3.

An explanation will be made below with reference to FIGS. 25A to 29C about the process of the formation of the pattern corresponding to the pattern in the first area 76A including the separation portions 74A, 74B in the circuit pattern 70 shown in FIG. 2. The portions shown in FIGS. 25A to 29C, which correspond to those shown in FIGS. 6A to 12C, are designated by the same reference numerals, and any detailed explanation of which will be omitted. FIGS. 25A to 29A each show an enlarged plan view illustrating the portion corresponding to the first area 76A in each of the shot areas on the surface of the wafer W2. FIGS. 25B to 29B show sectional views taken along lines BB' shown in FIGS. 25A to 29A respectively. FIGS. 25C to 29C show sectional views taken along lines CC' shown in FIGS. 25A to 29A respectively. In FIGS. 25A to 27A, the photoresist layer 60 described later on is depicted as a transparent member.

Figure 25C:
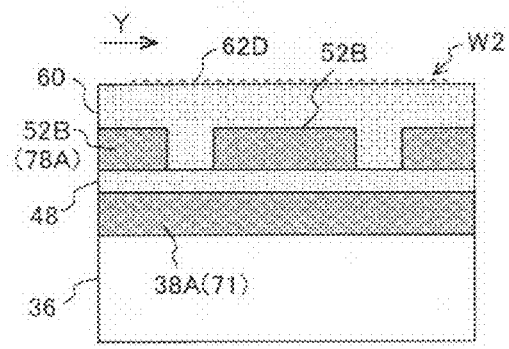
FIG. 25C shows a sectional view taken along a line CC' shown in FIG. 25A.
Figure 25D:
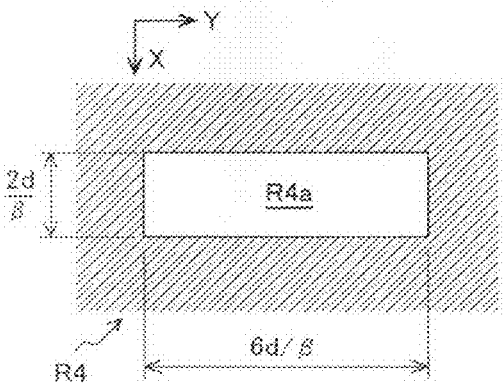
FIG. 25D shows an enlarged plan view of the pattern of the third reticle.

At first, in a step corresponding to Step 112 shown in FIG. 3, as shown in FIGS. 25B, 25C, for example, the positive type photoresist layer 60 is formed (coated) to cover the second L & S pattern 78A of the wafer W2. Subsequently, corresponding to Step 114, the portion corresponding to the first area 76A of each of the shot areas of the wafer W2 is exposed with an image 62D of an oblong aperture pattern R4a (slotted hole), having a width $2d/\beta$ in the X direction and a width $6d/\beta$ in the Y direction of a reticle R4 shown in FIG. 25D, as shown in FIG. 25A by the exposure apparatus 100. An ideal image A3 of the image 62D is an oblong image covering the separation portion 74A, 74B and having the width 2d in the X direction and the width 6d in the Y direction. However, no problem actually arises even when any deformation is caused to some extent, for example, due to the aberration. After that, the photoresist layer 60 of the wafer W2 is developed, and thus a first aperture 60D is formed at the portion corresponding to the image 62D as shown in FIG. 26A. In this embodiment, the oblong shape is depicted as the shape of the aperture pattern R4a of the reticle R4. However, there is no limitation to this. For example, a pattern, to which OPC (Optical proximity correction) process is applied, may be used as the aperture pattern.

Subsequently, in a step corresponding to Step 116, apertures are formed in the protective layer 48 of the wafer W2 via the aperture 60D by, for example, the dry etching. By doing so, as shown in FIGS. 26A to 26C, second apertures 48D, 48E of the protective layer 48 are formed by the portions at which the aperture 60D is overlapped with the space portions 79A of the second L & S pattern 78A (portions ranging over or straddling the separation portions 74A, 74B of the line pattern 38A). Subsequently, corresponding to Step 118, the etching is performed for the second L & S pattern 78A (silicon dioxide film in this embodiment), and the etching is performed for the line patterns 38A (silicon dioxide film in this embodiment) of the first L & S pattern 71 via the apertures 48D, 48E of the protective layer 48. Accordingly, as shown in FIGS. 27A to 27C, cutouts 38Aa, 38Ab are formed in the line pattern 38A at positions corresponding to the separation portions 74A, 74B in the apertures 48D, 48E. Further, cutouts 52Ba, 52Bb, 52Bc are also formed in the line pattern 52B of the second L & S pattern 78A.

Figure 29A:
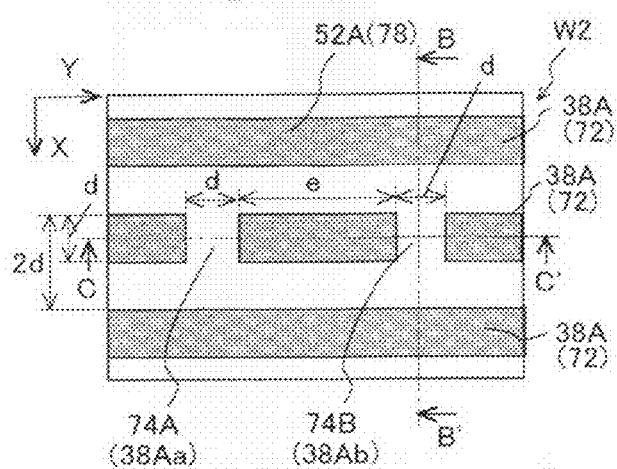
FIG. 29A shows an enlarged plan view of a part of the wafer W2 after removing the first protective layer.
Figure 29B:
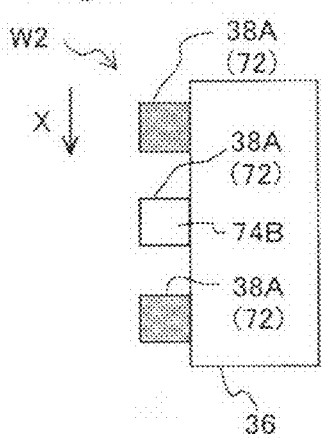
FIG. 29B shows a sectional view taken along a line BB' shown in FIG. 29A.
Figure 29C:
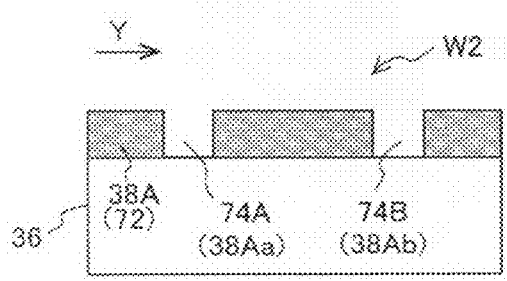
FIG. 29C shows a sectional view taken along a line CC' shown in FIG. 29A.

Subsequently, corresponding to Step 120, the remaining photoresist layer 60 is removed, for example, by the ashing. Corresponding to Step 122, the second L & S pattern 78A is removed, for example, by the etch back process. Accordingly, as shown in FIGS. 28A to 28C, the first L & S pattern 71 appears, in which the surface is covered with the protective layer 48 and the cutouts 38Aa, 38Ab are formed. Subsequently, corresponding to Step 124, the protective layer 48 is removed, for example, by the dry ashing. By doing so, as shown in FIGS. 29A to 29C, the first L & S pattern 71 is formed, which includes the line pattern 38A provided with the cutouts 38Aa, 38Ab.

According to this embodiment the following effects are obtained in addition to the effects of the respective embodiments described above. According to this embodiment, the second L & S pattern 78A is such a pattern that the width (d) of the space portion 79A is narrower than the width (3d) of the second line pattern 52B. The first aperture 60D of the photoresist layer 60 is the slotted hole having the size covering at least a part of the mutually adjacent two space portions 79A of the second L & S pattern 78A. Therefore, the cutouts 38Aa, 38Ab (separation portions 74A, 74B) can be formed at the two positions of the line pattern 38A by merely forming one slotted hole (aperture 60D). Therefore, it is possible to easily form the pattern which includes the non-periodic portion finer or more minute than the resolution limit of the exposure apparatus 100.

When forming the second L & S pattern 78A so as to cover the protective layer 48, the fourth pattern (the plurality of line patterns 50A) having the L & S pattern is formed on the protective layer 48, and the width of the line pattern 50A (or the space portion 56A, 56B) of the fourth pattern is thicker than ½ of the pitch (4d) of the fourth pattern, for example, the width is 3d. Therefore, the second L & S pattern 78A can be formed with ease.

The respective embodiments described above can be modified as follows.

(1) In the respective embodiments described above, the first L & S pattern 71 (first line patterns 38A, 71) and the second L & S pattern 78, 78A (second line patterns 52A, 77, 52B) are perpendicular to each other. However, the first L & S pattern 71 and the second L & S pattern 78, 78A may intersect at an angle smaller than 90°. A pattern, which includes at least one line pattern 38A, may be formed beforehand, instead of the first L & S pattern 71. A pattern, which includes at least one line pattern 52A, 52B, may be formed beforehand, instead of the second L.& S pattern 78, 78A.

(2) In the respective embodiments described above, the first L & S pattern 71 and the second L & S pattern 78 are formed by the spacer double patterning process. However, when forming at least one of the first L & S pattern 71 and the second L & S pattern 78, it is also allowable to apply the pitch-splitting process. Any one of the double exposure process and the double patterning process may be applied as the pitch-splitting process. In the respective embodiments described above, the L & S pattern, in which the pitch is ½, is formed from the original L & S pattern by, for example, the spacer double patterning process. However, an L & S pattern (to serve as the L & S pattern 71, 78), which has a pitch of 1/(2k) (k is an integer of not less than 1) with respect to the pitch of the original pattern, can be also formed from the original pattern. Accordingly, it is possible to form a finer circuit pattern.

(3) In the respective embodiments described above, the line patterns 38A, 71, which are included in the circuit pattern to be formed, are composed of silicon dioxide. However, any other material including, for example a conductive material (for example, copper) may be available as the material for the line patterns 38A, 71.

(4) In the respective embodiments described above, a part of the periodic pattern (first L & S pattern 71) is removed. However, in a case that a part of any non-periodic pattern is removed, it is also possible to apply the pattern forming method as referred to in the embodiments described above. In a case that a non-periodic pattern is added to a periodic pattern or a non-periodic pattern, it is also possible to apply the pattern forming method as described above.

Figure 30:
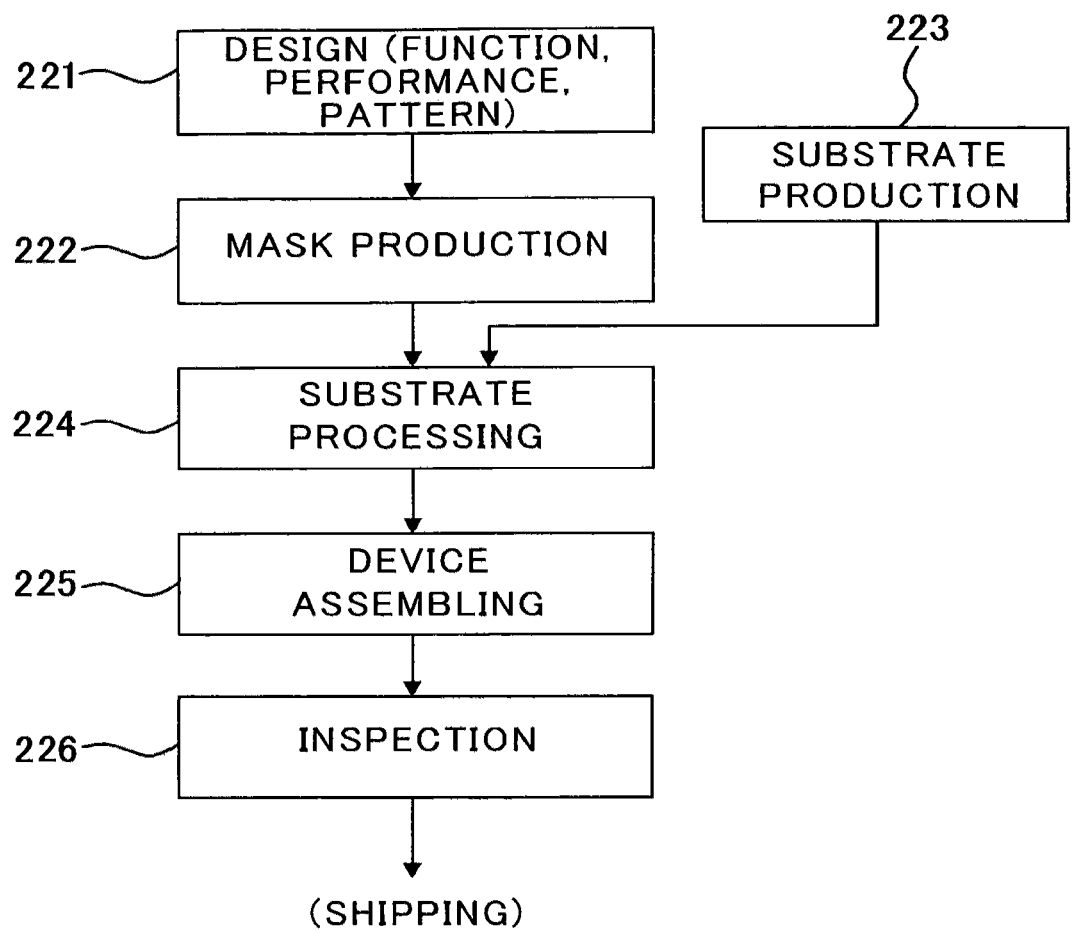
FIG. 30 shows a flow chart illustrating an example of steps of producing an electronic device.

Next, in a case that a semiconductor device (electronic device) such as SRAM or the like is produced by using the pattern forming method as referred to in the respective embodiments described above, as shown in FIG. 30, the semiconductor device is produced by performing: a step 221 of designing the function and the performance of the semiconductor device; a step 222 of manufacturing a mask (reticle) based on the designing step; a step 223 of producing a substrate (or a base material of wafer) for the semiconductor device; a substrate-processing step 224; a step 225 of assembling the device (including processing processes such as a dicing step, a bonding step, a packaging step, etc.); an inspection step 226; and the like. The substrate-processing step 224 includes a step of exposing the substrate with the pattern of the reticle by the exposure apparatus; a step of developing the exposed substrate; a step of heating (curing) and etching the developed substrate; and the like.

In other words, the method for producing the device includes the substrate-processing step 224, and the substrate-processing step 224 includes the step of forming the pattern by removing a part of the predetermined pattern (line pattern 38A, 72) on the substrate (wafer W, W1, W2) by using any one of the pattern forming methods of the respective embodiments described above. Further, as an example, the pattern formed on the substrate is the pattern obtained by removing a part of the periodic pattern (first L & S pattern 71).

According to the method for producing the device, a semiconductor device, which includes the circuit pattern containing the non-periodic portion finer than the resolution limit of the exposure apparatus, can be produced highly accurately by using the exposure apparatus.

The device, which is the production objective in the embodiment described above, can be any arbitrary semiconductor device including DRAM, CPU, DSP, etc., other than SRAM. Further, the pattern forming method of the embodiment described above can be also applied when producing an image pickup element other than the semiconductor device, or an electronic device (microdevice) such as MEMS (Microelectromechanical Systems) or the like.

In the embodiments described above, a dry type exposure apparatus, which is not of the liquid immersion type, may be used as the exposure apparatus. Other than the exposure apparatus which uses the ultraviolet light as the exposure light, it is also allowable to use, for example, an EUV exposure apparatus which uses the EUV light (Extreme Ultraviolet Light) having a wavelength of about several nm to several 10 nm as the exposure light.

The present teaching is not limited to the embodiments described above, and may be embodied in other various forms within a scope without deviating from the gist or essential characteristics of the present invention.

According to the conventional pattern forming method based on the pitch-splitting process or the spacer double patterning process, it is possible to form the periodic circuit pattern having the pitch finer than the resolution limit of the exposure apparatus. However, in the case of the conventional pattern forming method, it has been difficult to highly accurately form a circuit pattern including any non-periodic portion finer than the resolution limit of the exposure apparatus.

Taking the foregoing circumstances into consideration, an object of the present teaching is to make it possible to form a pattern finer than the resolution limit of the exposure apparatus.

According to the embodiments, it is possible to form the pattern finer than the resolution limit of the exposure apparatus.

What is claimed is:

1. A pattern forming method for forming a pattern, the method comprising:
   forming a first pattern having a first line pattern on a substrate;
   forming a first thin film to cover the first pattern;
   forming a second pattern, having a second line pattern extending in a direction intersecting the first line pattern, on the first thin film;
   forming a photosensitive layer to cover the second pattern;
   forming a third pattern having a first aperture in the photosensitive layer so that the third pattern is overlapped with at least a part of the second pattern;
   forming a second aperture in the first thin film by removing a part of the first thin film via the first aperture of the third pattern formed in the photosensitive layer;
   removing a part of the first pattern via the second aperture of the first thin film; and
   removing the first thin film and the second pattern.

2. The pattern forming method according to claim 1, wherein the first pattern has a line-and-space pattern in which a plurality of pieces of the first line pattern are arranged in a first direction; and
   the second pattern has a line-and-space pattern in which a plurality of pieces of the second line pattern are arranged in a second direction intersecting the first direction.

3. The pattern forming method according to claim 2, wherein the first pattern and the second pattern are formed such that:
   a fourth pattern, having a pitch which is twice a pitch of the first line pattern and a pitch of the second line pattern, is formed; and
   a line-and-space pattern, having a pitch which is ½ of the pitch of the fourth pattern, is formed by using the fourth pattern.

4. The pattern forming method according to claim 2, wherein the first aperture of the photosensitive layer has a size including at least a part of one space portion of the second pattern.

5. The pattern forming method according to claim 2, wherein the first aperture, which is formed in the photosensitive layer, has a slotted hole which has a size including at least a part of mutually adjacent two space portions of the second pattern; and
   the second aperture is formed at a position corresponding to the mutually adjacent two space portions.

6. The pattern forming method according to claim 2, wherein a second thin film is formed between the first thin film and the photosensitive layer to cover the second pattern;
   a third aperture is formed in the second thin film when the second aperture is formed in the first thin film; and
   the first pattern is etched via the third aperture of the second thin film, a space portion of the second pattern, and the second aperture of the first thin film when the part of the first pattern is removed.

7. The pattern forming method according to claim 2, wherein a space portion of the first pattern is filled with a fourth thin film when the first pattern is formed on the substrate;
   a portion, from which the first pattern is removed, is filled with a thin film composed of a same material as that of the fourth thin film after removing the first thin film and the second pattern; and
   the first pattern is removed.

8. The pattern forming method according to claim 7, wherein a recess, which is formed after the first pattern is removed in the first thin film, is filled with a material which is different from that of the first thin film.

9. The pattern forming method according to claim 7, wherein the fourth thin film is an insulating film having a small dielectric constant.

10. The pattern forming method according to claim 7, wherein the first thin film is an inorganic film, and the fourth thin film is an organic film.

11. The pattern forming method according to claim 1, wherein the second pattern has a line-and-space pattern in which a width of a space portion is narrower than a width of the second line pattern; and
the first aperture of the photosensitive layer has a slotted hole which has a size covering at least a part of mutually adjacent two space portions of the second pattern.

12. The pattern forming method according to claim 11, wherein a fourth pattern, which has a line-and-space pattern, is formed on the first thin film when the second pattern is formed to cover the first thin film; and a width of a space portion or a line pattern of the fourth pattern is thicker than ½ of a pitch of the fourth pattern.

13. The pattern forming method according to claim 1, wherein the formation of the first pattern, the formation of the first thin film, the formation of the second pattern, the formation of the photosensitive layer, the formation of the third pattern, the formation of the second aperture, the removal of the part of the first pattern, and the removal of the first thin film and the second pattern are performed in this order.

14. The pattern forming method according to claim 1, wherein the second aperture is formed by removing the part of the first thin film by dry etching.

15. A pattern forming method for forming a pattern, the method comprising:
forming a first line and space pattern having a plurality of first lines and a plurality of first spaces arranged alternately in a predetermined direction on a substrate;
forming a second line and space pattern, having a plurality of second lines and a plurality of second spaces arranged alternately in a direction intersecting the predetermined direction, on the first line and space pattern;
removing a partial area of a first line, included in the plurality of first lines and existing in a plurality of overlap areas in which the plurality of first lines of the first line and space pattern and the plurality of second spaces of the second line and space pattern are overlapped with one another, by performing etching using a pair of second lines, included in the plurality of second lines and defining the partial area of the first line, as a mask; and
removing the second line and space pattern to form a non-periodic line and space pattern in which a part of the first line of the first line and space pattern is removed.

16. The pattern forming method according to claim 15, wherein after forming the first line and space pattern, a protective layer is formed to cover the first line and space pattern;
the second line and space pattern is formed on the protective layer;
an area, of the protective layer, corresponding to the partial area of the first line in the plurality of overlap areas is removed; and
the partial area of the first line is removed by the etching via the removed area of the protective layer.

17. The pattern forming method according to claim 15, wherein a first mask plate having light-shielding line patterns arranged in the predetermined direction is used when the first line and space pattern is formed;
a second mask plate having light-shielding line patterns arranged in the direction intersecting the predetermined direction is used when the second line and space pattern is formed; and
a third mask plate having a light-transmitting portion, via which a light is irradiatable onto an area including the partial area of the first line in the overlap areas, is used when the partial area of the first line in the overlap areas is removed.

18. The pattern forming method according to claim 15, wherein the first line and space pattern and the second line and space pattern are formed by a spacer double patterning process.

19. The pattern forming method according to claim 15, wherein the pattern is formed with an exposure apparatus having a predetermined resolution limit; and
the removed part of the first line of the first line and space pattern has a line width which is less than the resolution limit.

20. The pattern forming method according to claim 15, wherein the non-periodic line and space pattern is formed by exposing the substrate with a local immersion method.

21. The pattern forming method according to claim 15, wherein the formation of the first line and space pattern, the formation of the second line and space pattern, the removal of the partial area of the first line, and the removal of the second line and space pattern are performed in this order.

22. The pattern forming method according to claim 15, wherein after forming the first line and space pattern and before forming the second line and space pattern, a protective layer is formed to cover the first line and space pattern, and an area, of the protective layer, corresponding to the partial area of the first line in the plurality of overlap area is removed by dry etching.

23. A method for producing a device, comprising a step of forming a pattern from which a part of a predetermined pattern is removed on a substrate by using the pattern forming method as defined in claim 1.

24. The method for producing the device according to claim 23, wherein the pattern formed on the substrate is a pattern from which a part of a periodic pattern is removed.

25. A method for producing a device, comprising a step of forming a pattern from which a part of a predetermined pattern is removed on a substrate by using the pattern forming method as defined in claim 15.

26. The method for producing the device according to claim 25, wherein the pattern formed on the substrate is a pattern from which a part of a periodic pattern is removed.

* * * * *